(12) United States Patent
Takaki et al.

(10) Patent No.: US 9,091,915 B2
(45) Date of Patent: Jul. 28, 2015

(54) RESIST COMPOSITION, METHOD OF FORMING RESIST PATTERN, POLYMERIC COMPOUND AND METHOD OF PRODUCING POLYMERIC COMPOUND

(71) Applicant: Tokyo Ohka Kogyo Co., Ltd., Kawasaki-shi (JP)

(72) Inventors: Daichi Takaki, Kawasaki (JP); Yoshiyuki Utsumi, Kawasaki (JP); Masatoshi Arai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 51 days.

(21) Appl. No.: 13/899,170

(22) Filed: May 21, 2013

(65) Prior Publication Data

US 2013/0316285 A1    Nov. 28, 2013

(30) Foreign Application Priority Data

May 23, 2012 (JP) ................. 2012-117707

(51) Int. Cl.
*G03F 7/039* (2006.01)
*G03F 7/004* (2006.01)
*G03F 7/20* (2006.01)
*G03F 7/30* (2006.01)
*C08F 8/14* (2006.01)
*C08F 8/18* (2006.01)

(52) U.S. Cl.
CPC ............... *G03F 7/0392* (2013.01); *C08F 8/14* (2013.01); *C08F 8/18* (2013.01); *G03F 7/0045* (2013.01); *G03F 7/0046* (2013.01); *G03F 7/2041* (2013.01); *G03F 7/30* (2013.01)

(58) Field of Classification Search
None
See application file for complete search history.

(56) References Cited

U.S. PATENT DOCUMENTS

| | | | |
|---|---|---|---|
| 2003/0059709 A1* | 3/2003 | Wheeler et al. | 430/270.1 |
| 2007/0172769 A1* | 7/2007 | Kanna et al. | 430/311 |
| 2009/0197204 A1 | 8/2009 | Shiono et al. | |
| 2009/0317743 A1 | 12/2009 | Shiono et al. | |
| 2010/0310985 A1 | 12/2010 | Mori et al. | |
| 2011/0117499 A1 | 5/2011 | Matsumiya et al. | |

FOREIGN PATENT DOCUMENTS

| | | |
|---|---|---|
| JP | A-2010-002870 | 1/2010 |
| JP | A-2010-032994 | 2/2010 |
| JP | A-2010-204187 | 9/2010 |
| JP | A-2010-277043 | 12/2010 |
| JP | A-2011-008001 | 1/2011 |
| JP | A-2011-013569 | 1/2011 |
| JP | A-2011-128226 | 6/2011 |

OTHER PUBLICATIONS

Johncock et al ("Preparation and Some Properties of 2,2,6,6-Tetrahydryl-F-Heptanedioic Acid and its Polyester with 1,1,5,5-Tetrahydryl-F-1,5-Pentanediol", Journal of Polymer Science: Part A: Polymer Chemistry, vol. 24, p. 2033-2045 (1986).*

* cited by examiner

*Primary Examiner* — Sin Lee
(74) *Attorney, Agent, or Firm* — Knobbe Martens Olson & Bear LLP

(57) ABSTRACT

A resist composition which generates acid upon exposure and exhibits changed solubility in an alkali developing solution under action of acid, the resist composition including a polymeric compound containing a base decomposable group in a main chain thereof.

16 Claims, No Drawings

RESIST COMPOSITION, METHOD OF FORMING RESIST PATTERN, POLYMERIC COMPOUND AND METHOD OF PRODUCING POLYMERIC COMPOUND

TECHNICAL FIELD

The present invention relates to a resist composition and a method of forming a resist pattern.

Priority is claimed on Japanese Patent Application No. 2012-117707, filed May 23, 2012, the content of which is incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits increased solubility in an alkali developing solution under the action of acid and an acid-generator component that generates acid upon exposure (Patent Documents 1 and 2).

DOCUMENTS OF RELATED ART

Patent Document

[Patent Document 1] Japanese Unexamined Patent Application, First Publication No. 2010-204187

[Patent Document 2] Japanese Unexamined Patent Application, First Publication No. 2011-008001

SUMMARY OF THE INVENTION

As further progress is made in lithography techniques and the application field for lithography techniques expand, further improvement in various lithography properties is demanded in an alkali developing process using a combination of a chemically amplified resist composition and an alkali developing solution.

For reducing defects (surface defects) of the resist pattern, a resist composition used in an alkali developing process is required to exhibit a high solubility in an alkali developing solution.

For example, in Patent Document 1, a polymeric compound including a structural unit having a fluorine atom is used as a base component. Further, in Patent Document 2, a polymeric compound including a structural unit having a fluorine atom is used as an additive component. In order to increase the solubility of a resist composition in an alkali developing solution, other than using a polymeric compound having a specific structural unit as in Patent Documents 1 and 2, decreasing the molecular weight of the polymeric compound can be considered. However, when the molecular weight of the polymeric compound is decreased, the following problems arise. In the case where the polymeric compound is used as a base component, the Tg of the resist film is decreased, and the lithography properties are deteriorated. On the other hand, in the case where the polymeric compound is used as an additive component, the surface segregation effect on the resist film is deteriorated.

The present invention takes the above circumstances into consideration, with an object of providing a resist composition which exhibits high solubility in an alkali developing solution and can reduce defects while maintaining the lithography properties; and a method for forming a resist pattern using the resist composition.

For solving the above-mentioned problems, the present invention employs the following embodiments.

Specifically, a first aspect of the present invention is a resist composition which generates acid upon exposure and exhibits changed solubility in an alkali developing solution under action of acid, the resist composition including a polymeric compound containing a base decomposable group in a main chain thereof.

A second aspect of the present invention is a method of forming a resist pattern, including: using a resist composition according to the first aspect to form a resist film on a substrate, subjecting the resist film to exposure, and subjecting the resist film to developing to form a resist pattern.

A third aspect of the present invention is a polymeric compound containing a base decomposable group represented by general formula (I) shown below in a main chain thereof

[Chemical Formula 1]

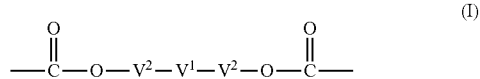

In the formula, $V^1$ represents a fluorinated alkylene group which may have a substituent; and $V^2$ each independently represents an alkylene group of 1 to 3 carbon atoms.

A fourth aspect of the present invention is a method of producing a compound of the third aspect.

According to the present invention, there are provided a resist composition which exhibits high solubility in an alkali developing solution and can reduce defects while maintaining the lithography properties; and a method for forming a resist pattern using the resist composition.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

<<Resist Composition>>

The resist composition of the present invention is a resist composition which generates acid upon exposure and exhibits changed solubility in a developing solution under action of acid, and which includes a base component (A) which exhibits changed solubility in a developing solution under action of acid (hereafter, referred to as "component (A)").

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

The resist composition of the present invention may be either a positive resist composition or a negative resist composition. Further, the resist composition of the present invention uses an alkali developing solution in a developing process during the formation of a resist pattern.

The resist composition of the present invention has a function of generating acid upon exposure, and in the resist composition, the base component may generate acid upon exposure, or an additive component other than the base component may generate acid upon exposure.

More specifically, the resist composition of the present invention may be a resist composition (1) containing an acid generator component (B) which generates acid upon exposure (hereafter, referred to as "component (B)";

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a resin component (A1') (hereafter, sometimes referred to as "component (A1')") which generates acid upon exposure and exhibits changed solubility in a developing solution under action of acid. As the component (A1'), a resin having a structural unit which generates acid upon exposure can be used. As the structural unit which generates acid upon exposure, a conventional structural unit can be used. In the present invention, the aforementioned resist composition (1) is most preferable.

<Base Component (A)>

The resist composition of the present invention preferably contains a base component (A) (hereafter, referred to as "base component (A)") which exhibits changed solubility in an alkali developing solution.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed. The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

(Structural Unit (a1))

The base component (A) preferably contains a structural unit (a1). The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 2]

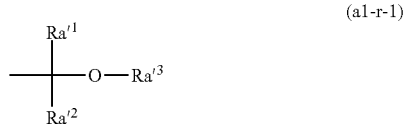

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 3]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 4]

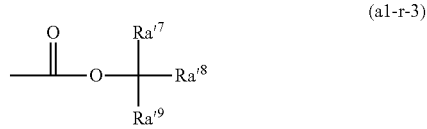

(a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), a structural unit represented by general formula (a1-1) shown below is preferable.

[Chemical Formula 5]

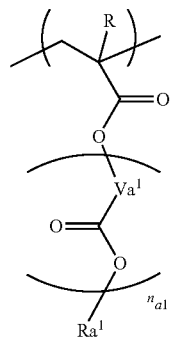

(a1-1)

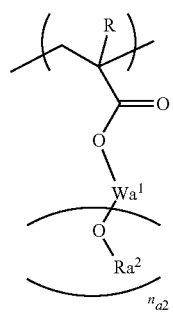

(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; $n_{a1}$ each independently represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In general formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

As the structural unit (a1-2), a structural unit represented by general formula (a1-2-01) shown below is particularly desirable.

[Chemical Formula 6]

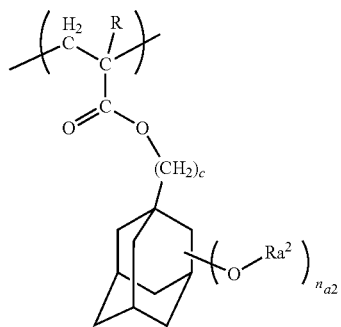

(a1-2-01)

In the formula (a1-2-01), $Ra^2$ represents an acid dissociable group represented by the aforementioned formula (a1-r-1) or (a1-r-3); $n_{a2}$ is an integer of 1 to 3, preferably 1 or 2, and more preferably 1; c is an integer of 0 to 3, preferably 0 or 1, and more preferably 1; and R is the same as defined above.

Specific examples of the structural units (a1-1) and (a1-2) are shown below. In the formulae shown below, $R^\alpha$ represents a hydrogen atom, a methyl group or a trifluoromethyl group.

[Chemical Formula 7]

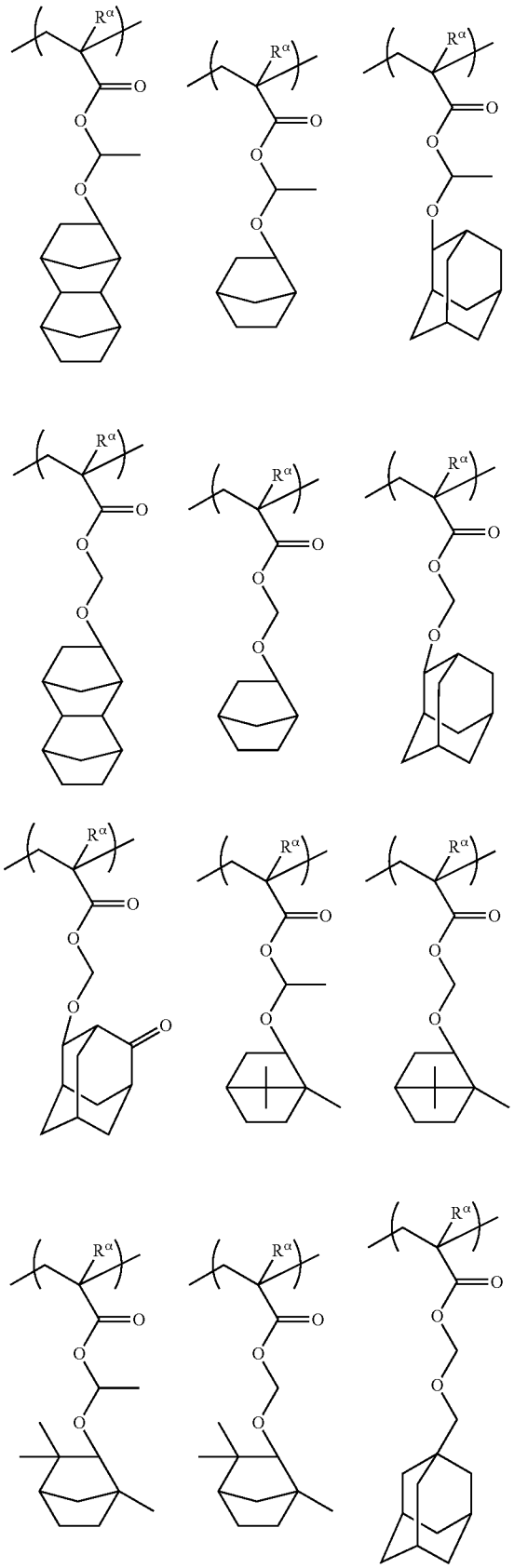

[Chemical Formula 8]
[Chemical Formula 9]
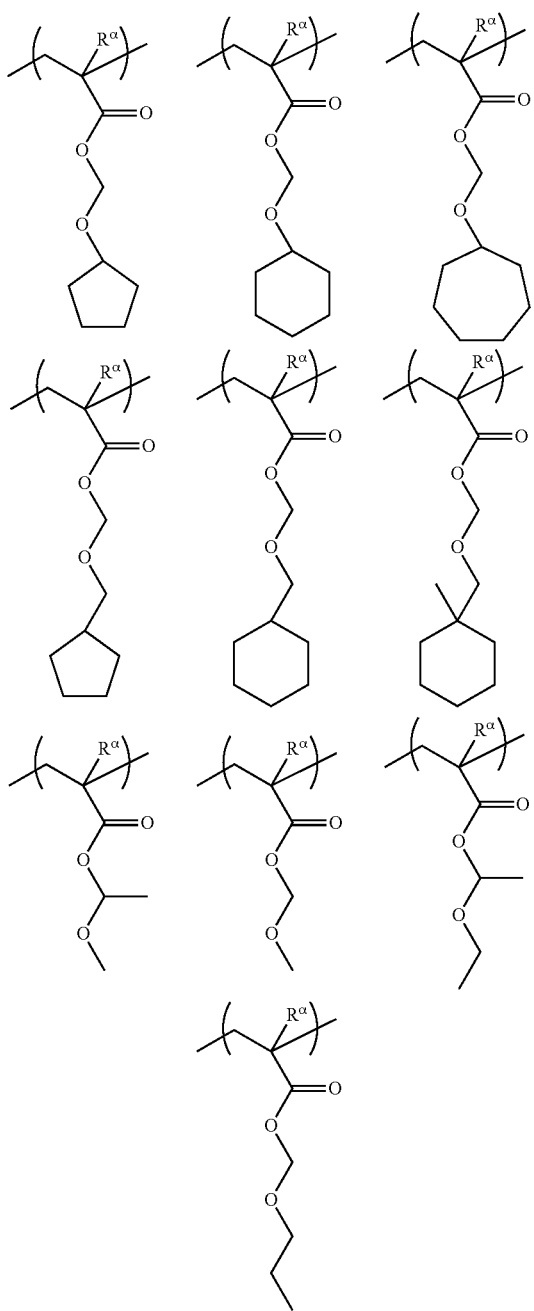
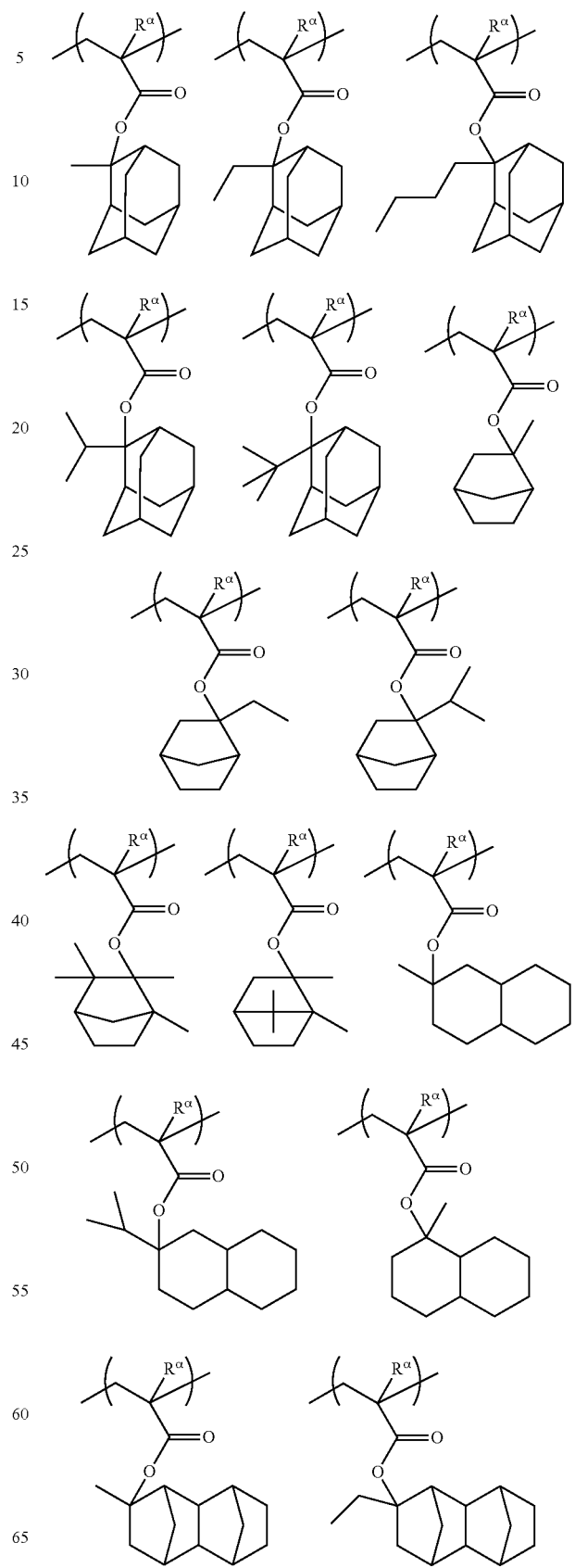

15
-continued
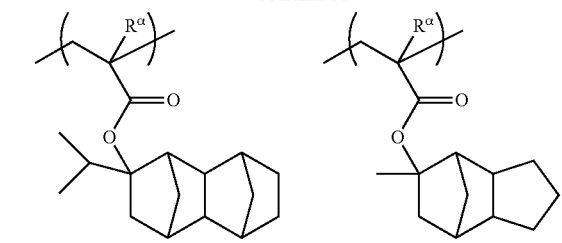
[Chemical Formula 10]
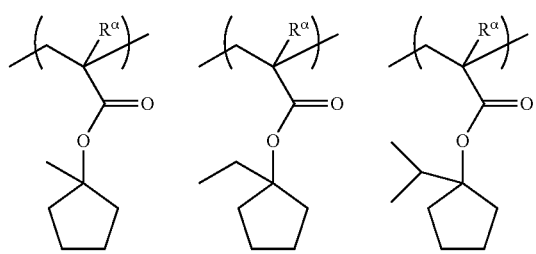
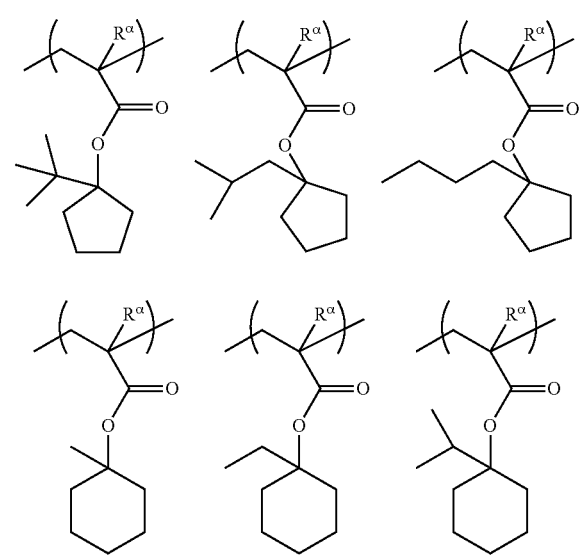
16
-continued
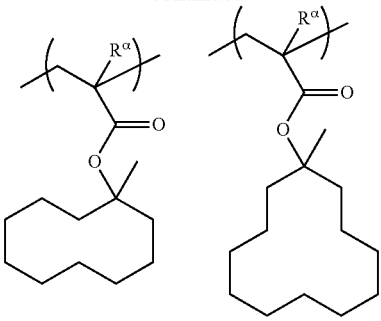
[Chemical Formula 11]
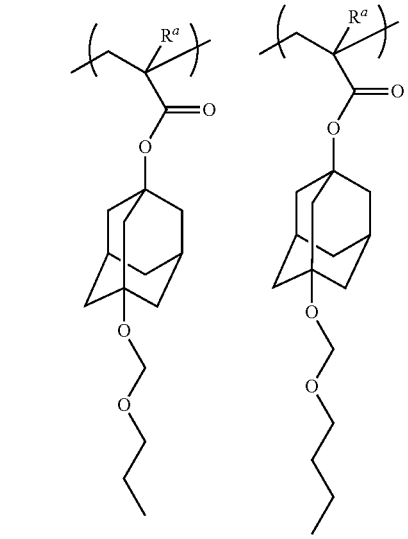

-continued

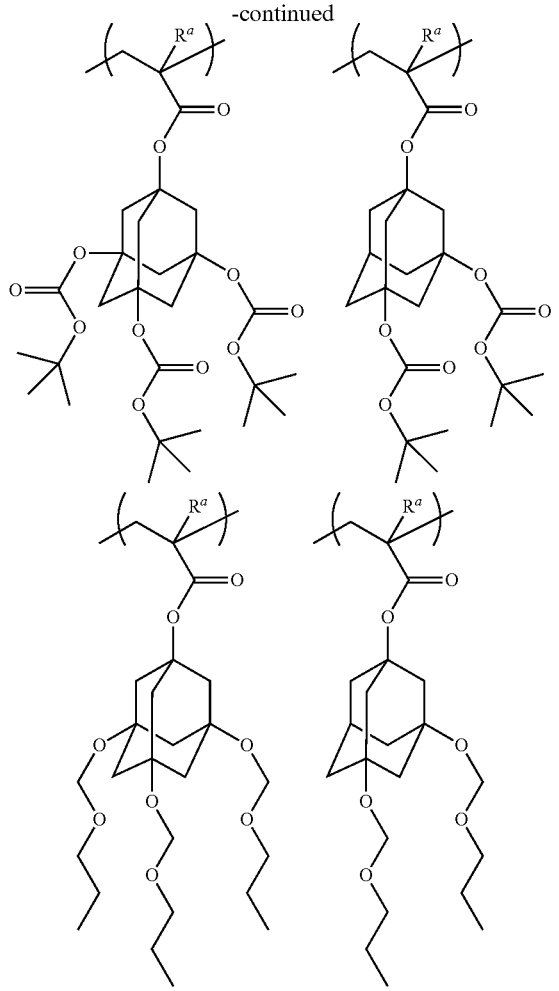

In the component (A), the amount of the structural unit (a1) based on the combined total of all structural units constituting the component (A) is preferably 20 to 80 mol %, more preferably 20 to 75 mol %, and still more preferably 25 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The base component (A) preferably further includes a structural unit (a2) containing a lactone-containing cyclic group.

When the component (A) is used for forming a resist film, the structural unit (a2) containing a lactone-containing cyclic group is effective in improving the adhesion between the resist film and the substrate.

The aforementioned structural unit (a1) which contains a lactone-containing cyclic group falls under the definition of the structural unit (a2); however, such a structural unit is regarded as a structural unit (a1), and does not fall under the definition of the structural unit (a2).

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples include groups represented by general formulas (a2-r-1) to (a2-r-7) shown below.

[Chemical Formula 12]

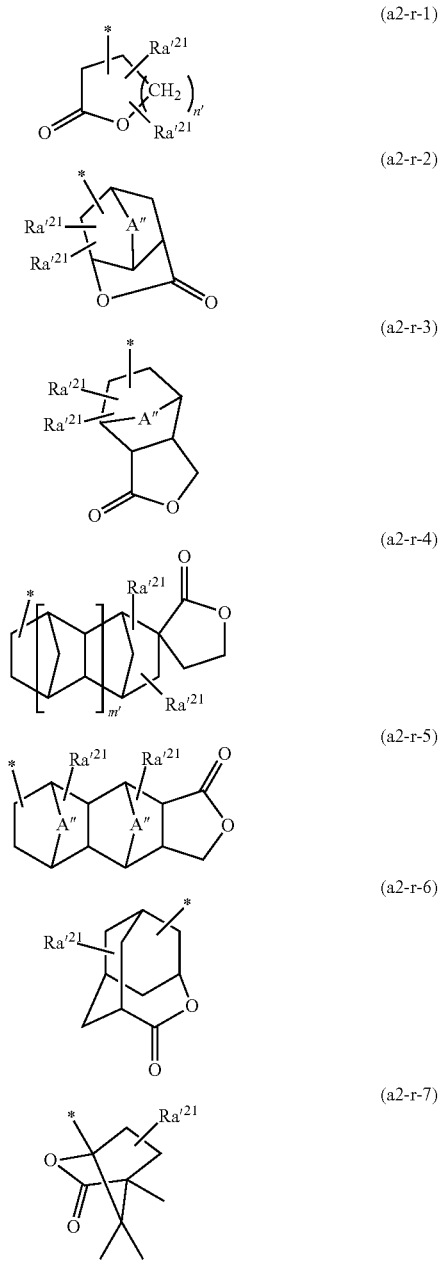

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A"

represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a2-r-1) to (a2-r-7) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—$CH_2$—, —$CH_2$—O—$CH_2$—, —S—$CH_2$— and —$CH_2$—S—$CH_2$—. As A", an alkylene group of 1 to 5 carbon atoms or —O— is preferable, more preferably an alkylene group of 1 to 5 carbon atoms, and most preferably a methylene group.

The alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms. Further, the alkoxy group is preferably a linear or branched alkoxy group. Specific examples of the alkoxy group include the aforementioned alkyl groups for the substituent having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl groups has been substituted with the aforementioned halogen atoms.

As examples of the halogenated alkyl group for $Ra'^{21}$, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group for $Ra'^{21}$, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for $Ra'^{21}$ preferably has 1 to 6 carbon atoms, and specific examples thereof include the aforementioned alkyl groups for the substituent in which at least one hydrogen atom has been substituted with a hydroxy group.

Specific examples of the groups represented by the aforementioned general formulae (a2-r-1) to (a2-r-7) are shown below.

[Chemical Formula 13]

(r-lc-1-1)

(r-lc-1-2)

(r-lc-1-3)

(r-lc-1-4)

(r-lc-1-5)

(r-lc-1-6)

(r-lc-1-7)

(r-lc-2-1)

(r-lc-2-2)
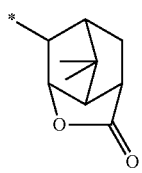
(r-lc-2-3)
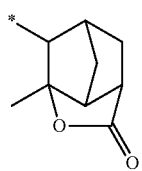
(r-lc-2-4)
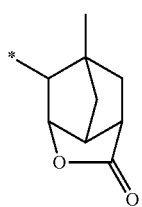
(r-lc-2-5)
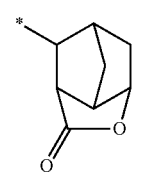
(r-lc-2-6)
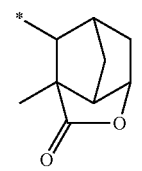
(r-lc-2-7)
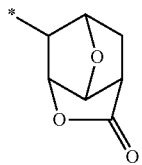
(r-lc-2-8)
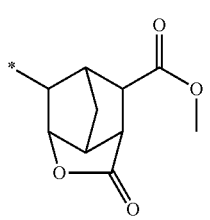
(r-lc-2-9)
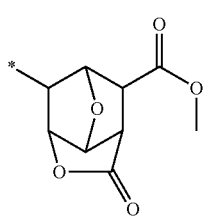
(r-lc-2-10)
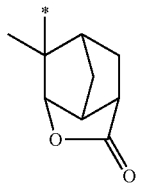
(r-lc-2-11)
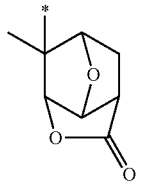
(r-lc-2-12)
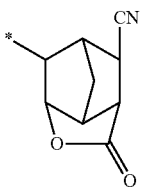
(r-lc-2-13)
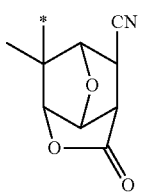
(r-lc-3-1)
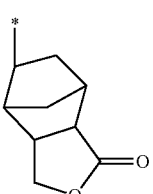
(r-lc-3-2)
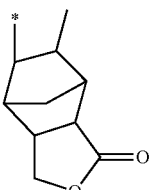
(r-lc-3-3)
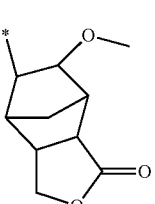
(r-lc-3-4)
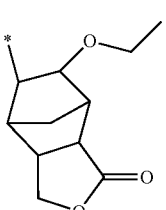

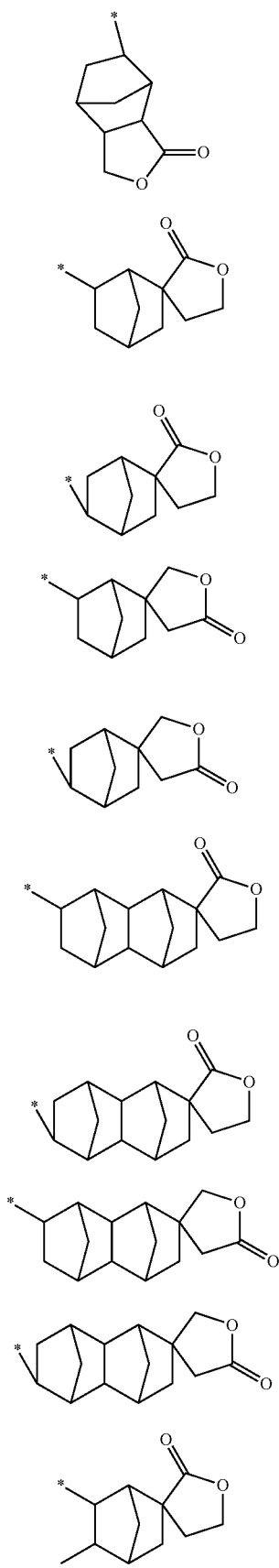
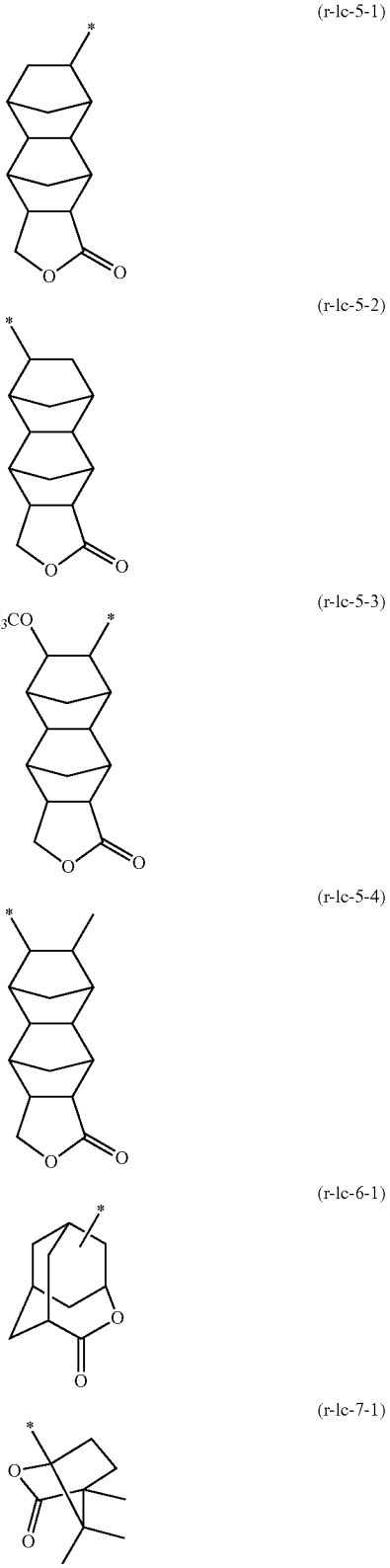
As long as the structural unit (a2) has a lactone-containing cyclic group, the structure of the other portions is not particularly limited. For example, a structural unit represented by general formula (a2-1) shown below can be mentioned.

[Chemical Formula 14]

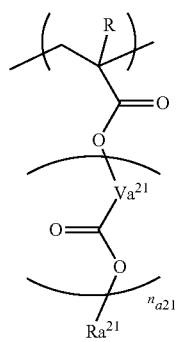

(a2-1)

In the formula, R represents a hydrogen atom, an alkyl group of 1 to 5 carbon atoms or a halogenated alkyl group of 1 to 5 carbon atoms; $Va^{21}$ represents an alkyl group of 1 to 5 carbon atoms; $Ra^{21}$ represents a group represented by any one of the aforementioned general formulae (a2-r-1) to (a2-r-7); and $na_{21}$ represents 0 or 1.

The alkyl group for R is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

As $Va^{21}$, an alkylene group of 1 to 3 carbon atoms is preferable.

Specific examples of the structural unit represented by general formula (a2-1) are shown below. In the formulae shown below, $R^\alpha$ represents a hydrogen atom, a methyl group or a trifluoromethyl group.

[Chemical Formula 15]

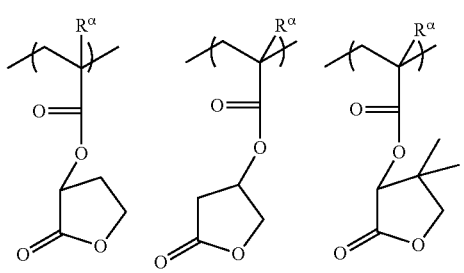

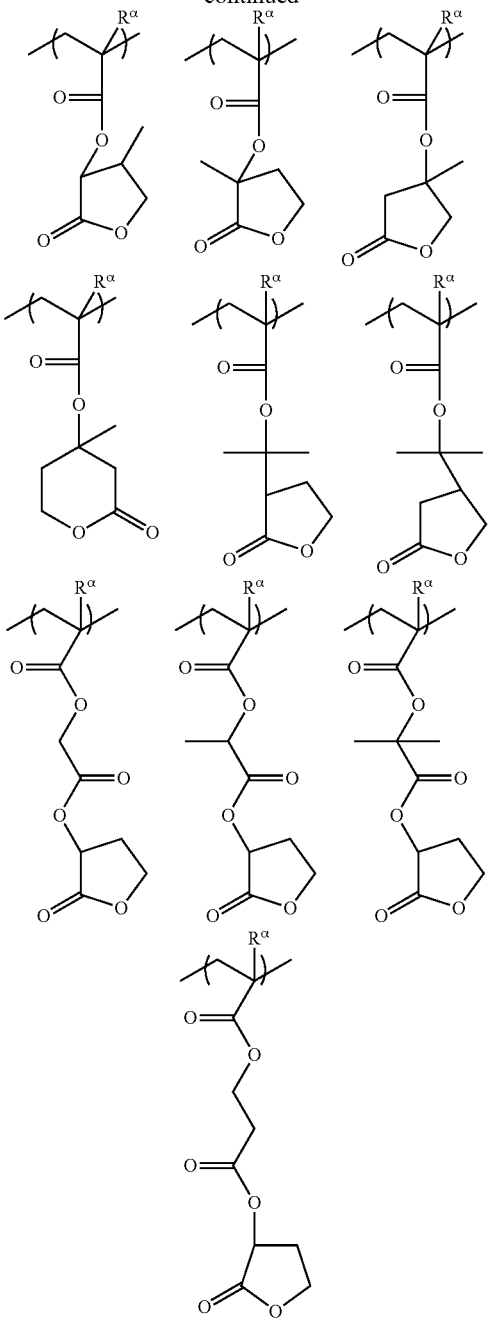

(Structural Unit (a3))

The base component (A) may contain a structural unit (a3). The structural unit (a3) is a structural unit containing a polar group-containing aliphatic hydrocarbon group (provided that the structural units that fall under the definition of structural units (a1) and (a2) are excluded).

When the base component (A) includes the structural unit (a3), it is presumed that the hydrophilicity of the base component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 16]

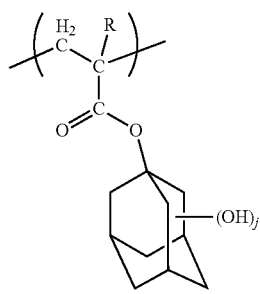
(a3-1)

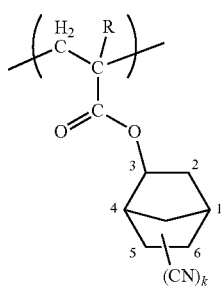
(a3-2)

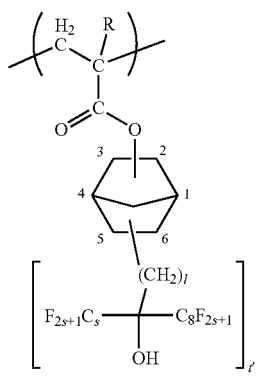
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the base component (A), 1 type of structural unit may be used, or 2 or more types may be used.

In the base component (A), the amount of the structural unit (a3) based on the combined total of all structural units constituting the base component (A) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

If desired, the base component (A) may further include a structural unit (a4) containing an acid non-dissociable cyclic group. When the component (A1) includes the structural unit (a4), dry etching resistance of the resist pattern to be formed is improved. Further, it is considered that the hydrophobicity of the base component (A) is improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit derived from an acrylate ester which contains an acid non-dissociable aliphatic polycyclic group is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Further as the structural unit (a4), a structural unit derived from an acrylate ester containing an acid non-dissociable aromatic group, a structural unit derived from styrene and a structural unit derived from hydroxystyrene are also preferable.

Specific examples of the structural unit (a4) include structural units represented by general formulae (a4-1) to (a4-6) shown below, vinyl(hydroxy)naphthalene, (hydroxy)naphthyl (meth)acrylate and (hydroxy)benzyl (meth)acrylate.

[Chemical Formula 17]

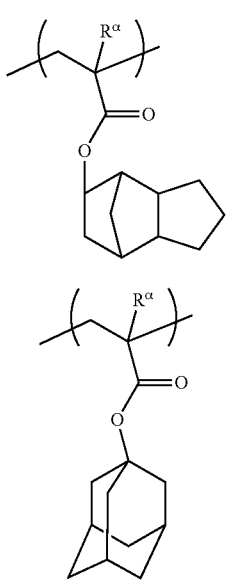

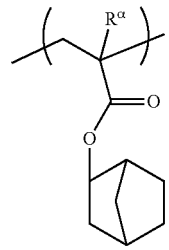

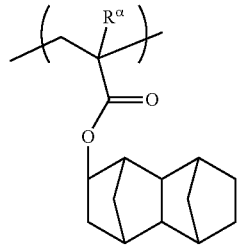

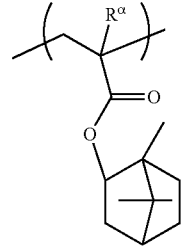

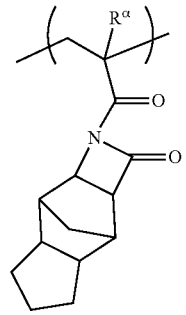

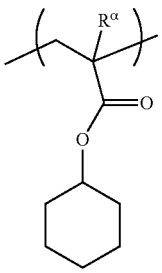

In the formulae, $R^\alpha$ represents a hydrogen atom, a methyl group or a trifluoromethyl group.

When the structural unit (a4) is included in the base component (A), the amount of the structural unit (a4) based on the combined total of all the structural units that constitute the base component (A) is preferably within the range from 1 to 30 mol %, and more preferably from 10 to 20 mol %.

(Structural Unit (a5))

The base component (A) preferably further includes a structural unit (a5) containing an —$SO_2$— containing cyclic group.

Here, an "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$-containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

More specific examples of the —SO$_2$— containing cyclic group include groups represented by general formulas (a5-r-1) to (a5-r-4) shown below.

[Chemical Formula 18]

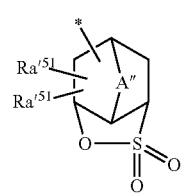
(a5-r-1)

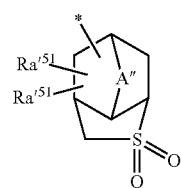
(a5-r-2)

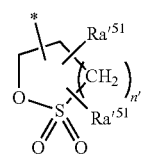
(a5-r-3)

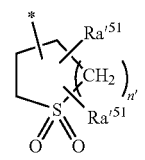
(a5-r-4)

In the formulae, each Ra'$^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4), A" is the same as defined for A" in general formulae (a2-r-1) to (a2-r-7). The alkyl group, alkoxy group, halogen atom, halogenated alkyl group, —COOR", —OC(=O)R" and hydroxyalkyl group for Ra'$^{51}$ are the same as defined for Ra'$^{21}$ in the aforementioned general formulae (a1-r-1) to (a2-r-7).

Specific examples of the groups represented by the aforementioned general formulas (a5-r-1) to (a5-r-4) are shown below. In the formulae shown below, "Ac" represents an acetyl group.

[Chemical Formula 19]

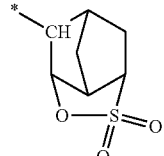
(r-sl-1-1)

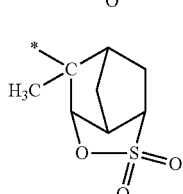
(r-sl-1-2)

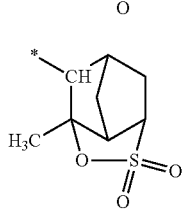
(r-sl-1-3)

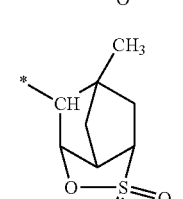
(r-sl-1-4)

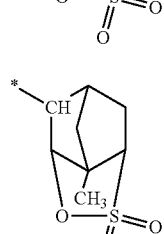
(r-sl-1-5)

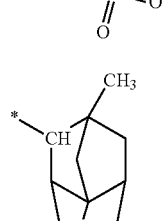
(r-sl-1-6)

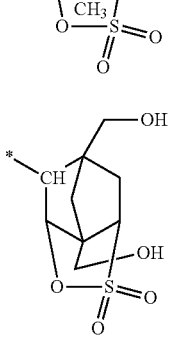
(r-sl-1-7)

-continued
(r-sl-1-8)
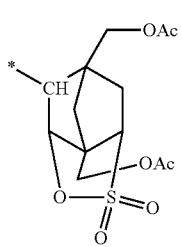
(r-sl-1-9)
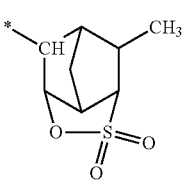
(r-sl-1-10)
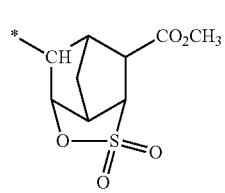
(r-sl-1-11)
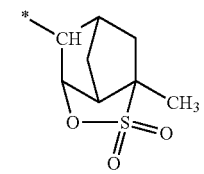
(r-sl-1-12)
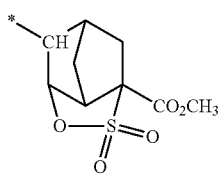
(r-sl-1-13)
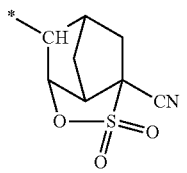
(r-sl-1-14)
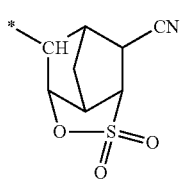
(r-sl-1-15)
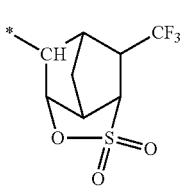
-continued
(r-sl-1-16)
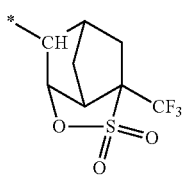
(r-sl-1-17)
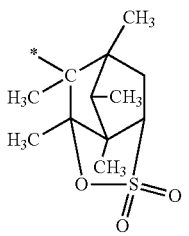
(r-sl-1-18)
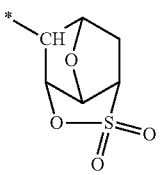
(r-sl-1-19)
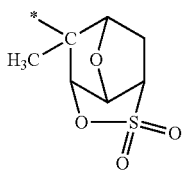
(r-sl-1-20)
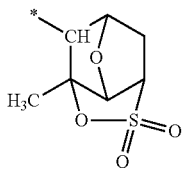
(r-sl-1-21)
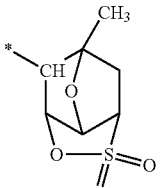
[Chemical Formula 20]
(r-sl-1-22)
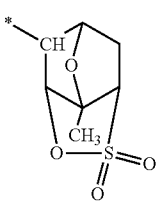

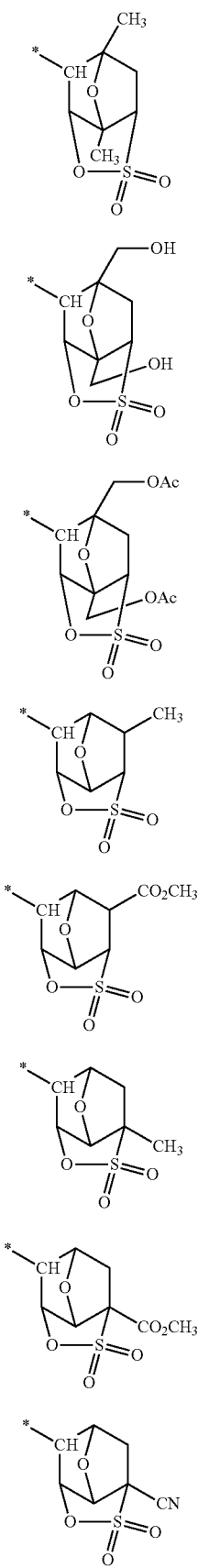
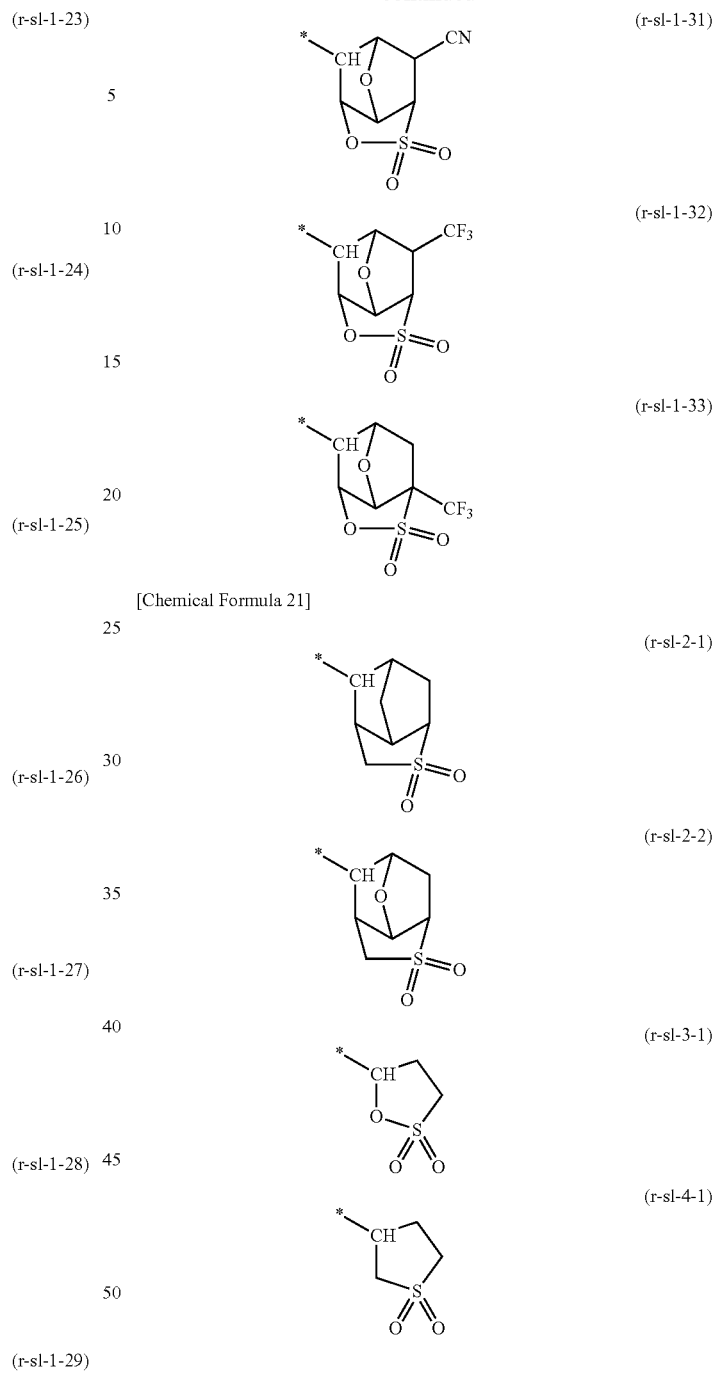

As long as the structural unit (a5) has an —SO$_2$— containing cyclic group, the structure of the other portions is not particularly limited. For example, a structural unit represented by general formula (a2-1) in which Ra$^{21}$ represents a group represented by any one of general formulae (a5-r-1) to (a5-r-4) can be mentioned.

As the —SO$_2$— containing cyclic group, a group represented by the aforementioned general formula (a5-r-1) is preferable, at least one member selected from the group consisting of groups represented by the aforementioned chemical formulas (a1-r-1-1), (r-s1-1-18), (r-s1-3-1) and (r-s1-4-1) is more preferable, and a group represented by chemical formula (a1-r-1-1) is most preferable.

In the present invention, the base component (A) may have a base decomposable group described later or a base decomposable group represented by general formula (I) described later.

The base component (A) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the base component (A), by using a chain transfer agent such as HS—CH$_2$—CH$_2$—CH$_2$—C(CF$_3$)$_2$—OH, a —C(CF$_3$)$_2$—OH group can be introduced at the terminals of the polymeric compound (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the base component (A) is not particularly limited, but is preferably 1,000 to 50,000, more preferably 1,500 to 40,000, and most preferably 2,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 4.0, and most preferably 1.0 to 3.0. Here, Mn is the number average molecular weight.

As the base component, one type of component may be used alone, or two or more types of components may be used in combination.

In the resist composition of the present invention, as the base component (A), one type may be used, or two or more types of compounds may be used in combination.

In the resist composition of the present invention, the amount of the base component (A) can be appropriately adjusted depending on the thickness of the resist film to be formed, and the like.

In the resist composition of the present invention, the amount of the base component (A) can be appropriately adjusted depending on the thickness of the resist film to be formed, and the like.

<Base Decomposable Group>

The resist composition of the present invention includes a polymeric compound containing a base decomposable group in a main chain thereof.

A base dissociable group refers to a group that is decomposable by the action of an alkali developing solution. The expression "decomposable in an alkali developing solution" means that the group is decomposable by the action of a 0.1 to 30 wt % alkali developing solution (preferably decomposable by action of a 2.38% by weight aqueous solution of tetramethylammonium hydroxide (TMAH) at 23° C.), and exhibits increased solubility in the alkali developing solution. The reason for this is that an ester bond is decomposed (hydrolyzed) by the action of a base (alkali developing solution), so as to generate a hydrophilic group. The base decomposable group is not particularly limited as long as it is a group which is decomposed by a base so as to render the polymer soluble in an alkali developing solution, and any of the groups that have been conventionally proposed as base decomposable groups for the base resins of chemically amplified resists can be used.

The resist composition of the present invention preferably includes a polymeric compound containing a base decomposable group represented by general formula (I) shown below in a main chain thereof

[Chemical Formula 22]

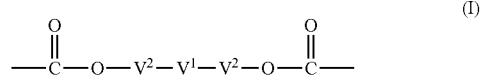

In the formula, V$^1$ represents a fluorinated alkylene group which may have a substituent; and V$^2$ each independently represents an alkylene group of 1 to 3 carbon atoms.

In general formula (I), V$^1$ represents a fluorinated alkylene group which may have a substituent.

Examples of the fluorinated alkylene group for V$^1$ include a linear or branched alkylene group in which part or all of the hydrogen atoms have been substituted with a fluorine atom. The alkylene group preferably has 1 to 12 carbon atoms, more preferably 1 to 5, and most preferably 2 to 4.

Specific examples of V$^1$ include —CF$_2$—, —CF$_2$CF$_2$—, —CF$_2$CF$_2$CF$_2$—, —(CF$_2$)$_4$—, —(CF$_2$)$_6$—, —(CF$_2$)$_8$—, —CF(CF$_3$)CF$_2$—, —CF(CF$_2$CF$_3$)—, —C(CF$_3$)$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CF$_2$CH$_2$CF$_2$—, —CF$_2$CH$_2$CH$_2$CF$_2$—, —CF$_2$CH$_2$CF$_2$CF$_2$—, —CF$_2$CH(CF$_3$)CH$_2$CF$_2$—, —CF$_2$CH(CF$_2$CF$_3$)CF$_2$—, —CF$_2$C(CH$_3$)(CF$_3$)CF$_2$—, —CF$_2$CH$_2$CH$_2$CH$_2$CF$_2$—, —CF$_2$CH$_2$CH$_2$CF$_2$CF$_2$—, —CH(CF$_3$)CH$_2$CH$_2$CF$_2$—, —CF$_2$CH$_2$CH(CF$_3$)CH$_2$CF$_2$—, —CH(CF$_3$)CH(CF$_3$)— and —C(CF$_3$)$_2$CH$_2$CF$_2$—.

The fluorinated alkylene group may have a substituent.

For example, part of the methylene group(s) (or fluoromethylene group(s)) within the fluorinated alkylene group for V$^1$ may be substituted with a divalent aliphatic cyclic group or aromatic cyclic group having 5 to 10 carbon atoms. The aliphatic cyclic group is preferably a divalent group in which one hydrogen atom has been removed from the cyclic hydrocarbon group for Ra'$^3$, and a cyclohexylene group, 1,5-adamantylene group or 2,6-adamantylene group is preferable.

Examples of other substituents for the fluorinated alkylene group include an alkoxy group of 1 to 4 carbon atoms, and a hydroxy group.

In general formula (I), V$^2$ each independently represents an alkylene group of 1 to 3 carbon atoms. The carbon atom of V$^1$ adjacent to V$^1$ preferably has a fluorine atom bonded thereto. As the alkylene group of 1 to 3 carbon atoms, a linear or branched alkylene group is preferable, and examples thereof include a methylene group, an ethylene group and an n-propylene group. In the present invention, V$^2$ is preferably a methylene group or an ethylene group.

Specific examples of the group represented by general formula (I) are shown below.

[Chemical Formula 23]

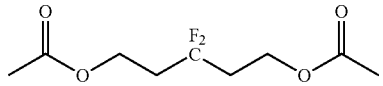

39

-continued

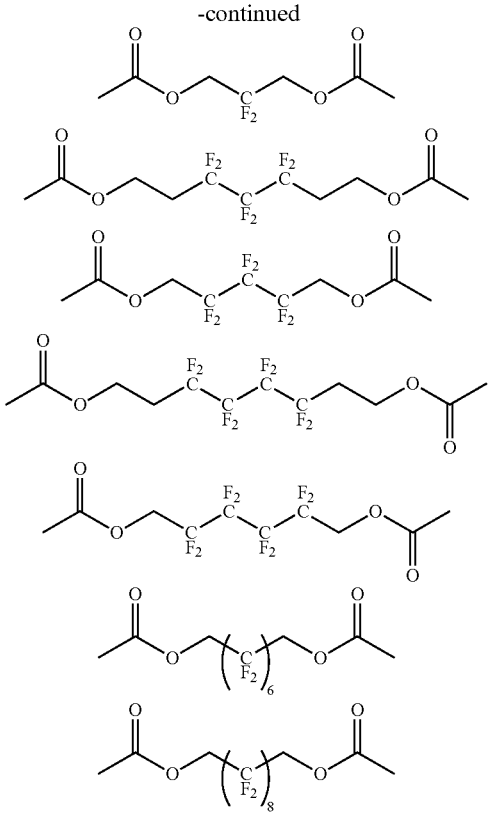

By virtue of including a polymeric compound containing a base decomposable group in a main chain thereof, the resist composition of the present invention exhibits an increased solubility in an alkali developing solution during alkali developing. More specifically, is presumed that the main chain is decomposed as shown in the reaction formula (I') below.

[Chemical Formula 24]

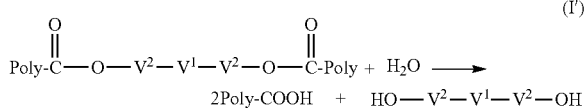

In the formula, $V^1$ represents a fluorinated alkylene group which may have a substituent; and $V^2$ each independently represents an alkylene group of 1 to 3 carbon atoms.

In the reaction formula (I'), $V^1$ and $V^2$ are the same as defined for $V^1$ and $V^2$ in the aforementioned formula (I).

<Acid Generator Component; Component (B)>

The component (B) is an acid generator component which generates acid upon exposure.

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

40

As an onium salt acid generator, a compound represented by general formula (b-1) or (b-2) shown below can be used.

[Chemical Formula 25]

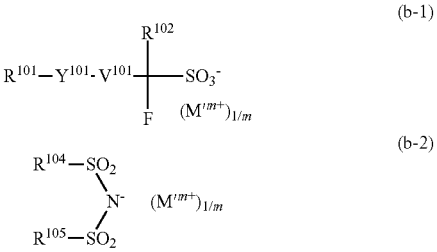

In the formulae, $R^{101}$ represents a cyclic group which may have a substituent, a chain-like alkyl group which may have a substituent, or a chain-like alkenyl group which may have a substituent; $Y^{101}$ represents a single bond or a divalent linking group containing an oxygen atom; $V^{101}$ represents a single bond, an alkylene group or a fluorinated alkylene group; $R^{102}$ represents a fluorine atom or a fluorinated alkyl group of 1 to 5 carbon atoms; $R^{104}$ and $R^{105}$ each independently represents an alkyl group of 1 to 10 carbon atoms or a fluorinated alkyl group of 1 to 10 carbon atoms, and may be mutually bonded to form a ring; and $M^{m+}$ represents an organic cation having a valency of m.

{Anion Moiety}

In the formula (b-1), $R^{101}$ represents a cyclic group which may have a substituent, a chain-like alkyl group which may have a substituent or a chain-like alkenyl group which may have a substituent. The cyclic group is preferably a cyclic hydrocarbon group. The cyclic hydrocarbon group may be an aromatic hydrocarbon group or an aliphatic hydrocarbon group.

Examples of the aromatic hydrocarbon group for $R^{101}$ include the aromatic hydrocarbon rings described above for the divalent aromatic hydrocarbon group, and an aryl group in which one hydrogen atom has been removed from an aromatic compound having two or more aromatic rings, and a phenyl group or a naphthyl group is preferable.

Examples of the cyclic aliphatic hydrocarbon group for $R^{101}$ include groups in which one hydrogen atom has been removed from a monocycloalkane or a polycycloalkane described above for the divalent aliphatic hydrocarbon group, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —$SO_2$—containing cyclic groups represented by the aforementioned formulas (a5-r-1) to (a5-r-4) and heterocycles shown below.

[Chemical Formula 26]

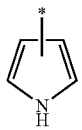

(r-hr-1)

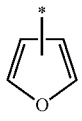

(r-hr-2)

(r-hr-3) 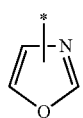

(r-hr-4) 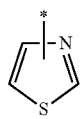

(r-hr-5) 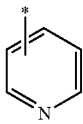

(r-hr-6) 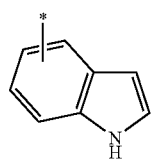

(r-hr-7) 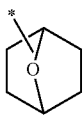

(r-hr-8) 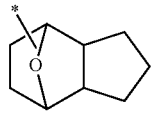

(r-hr-9) 

(r-hr-10) 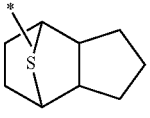

(r-hr-11) 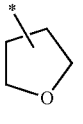

(r-hr-12) 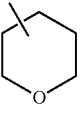

(r-hr-13) 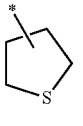

(r-hr-14) 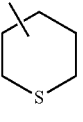

(r-hr-15) 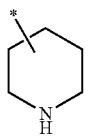

(r-hr-16) 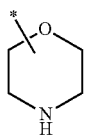

As the substituent for the cyclic hydrocarbon group for $R^{101}$, an alkyl group, an alkoxy group, a halogen atom, a halogenated alkyl group, a hydroxyl group, an oxygen atom (=O), a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the halogenated alkyl group as the substituent for the aforementioned aromatic hydrocarbon group include groups in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The chain-like alkyl group for $R^{101}$ may be linear or branched. The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The chain-like alkenyl group for $R^{101}$ preferably has 2 to 10 carbon atoms, more preferably 2 to 5, still more preferably 2 to 4, and most preferably 3. Examples thereof include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

As the substituent for the chain-like alkyl group or alkenyl group for $R^{101}$, an alkoxy group, a halogen atom, a halogenated alkyl group, a hydroxyl group, an oxygen atom (=O), a nitro group, an amino group, a cyclic group for $R^{101}$ or the like can be used.

In the present invention, $R^{101}$ is preferably a cyclic hydrocarbon group which may have a substituent, and a phenyl group, a naphthyl group, a group in which one or more hydrogen atoms have been removed from a polycycloalkane, lactone-containing cyclic groups represented by the formulas (a2-r-1) to (a2-r-7), —SO₂— containing cyclic groups represented by the formulas (a5-r-1) to (a5-r-4) or the like are preferable.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO₂—) bonded thereto. As the combination, the linking group represented by formulas (y-al-1) to (y-al-7) shown below can be mentioned.

[Chemical Formula 27]

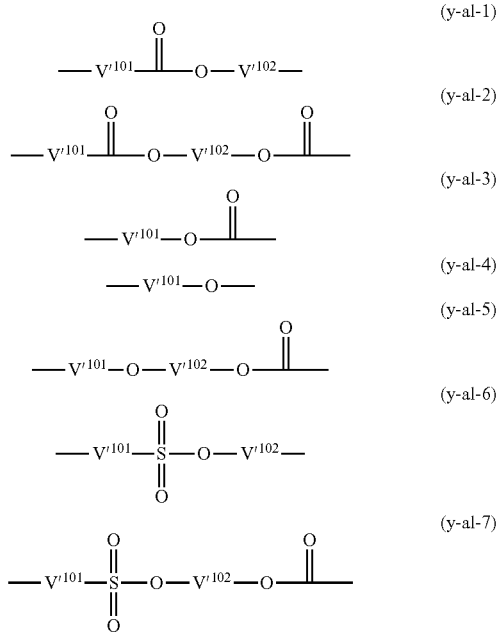

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

Specific examples of the alkylene group for $V'^{101}$ and $V'^{102}$ include a methylene group [—CH₂—]; alkylmethylene groups such as —CH(CH₃)—, —CH(CH₂CH₃)—, —C(CH₃)₂—, —C(CH₃)(CH₂CH₃)—, —C(CH₃) (CH₂CH₂CH₃)— and —C(CH₂CH₃)₂—; an ethylene group [—CH₂CH₂—]; alkylethylene groups such as —CH(CH₃)CH₂—, —CH(CH₃)CH(CH₃)—, —C(CH₃)₂CH₂— and —CH(CH₂CH₃)CH₂—; a trimethylene group (n-propylene group) [—CH₂CH₂CH₂—]; alkyltrimethylene groups such as —CH(CH₃)CH₂CH₂— and —CH₂CH(CH₃)CH₂—; a tetramethylene group [—CH₂CH₂CH₂CH₂—]; alkyltetramethylene groups such as —CH(CH₃)CH₂CH₂CH₂— and —CH₂CH(CH₃)CH₂CH₂—; and a pentamethylene group [—CH₂CH₂CH₂CH₂CH₂—]. Among these, a linear alkylene group is preferable.

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $Ra'^{3}$, and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (a1-r-1) to (y-a1-5) are preferable.

In the formula (b-1), $V^{101}$ is preferably a single bond or a fluorinated alkylene group of 1 to 4 carbon atoms.

In the formula (b-1), $R^{102}$ is preferably a fluorine atom or a perfluoroalkyl group of 1 to 5 carbon atoms, and is more preferably a fluorine atom.

As specific examples of anion moieties of the formula (b-1), fluorinated alkylsulfonate anions such as a trifluoromethanesulfonate anion or a perfluorobutanesulfonate anion when $Y^{101}$ is a single bond, and anions represented by formula (an-1) to (an-3) shown below when $Y^{101}$ is a divalent linking group containing an oxygen atom can be mentioned.

[Chemical Formula 28]

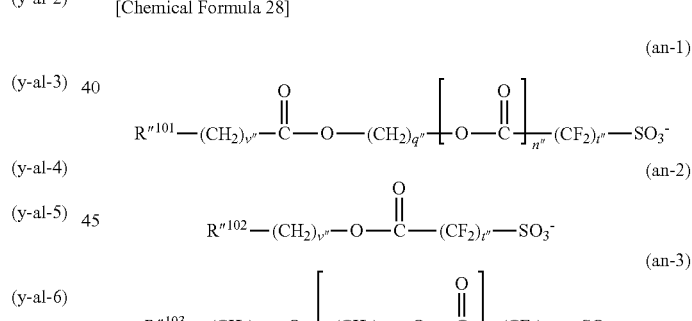

In the formulae, $R'''^{101}$ represents an cyclic group which may have a substituent, a group represented by any one of the aforementioned formulas (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulas (a2-r-1) to (a2-r-7) or an —SO₂— containing cyclic group represented by any one of the aforementioned formulas (a5-r-1) to (a5-r-4); $R'''^{103}$ represents an aromatic cyclic group which may have a substituent or a chain-like alkenyl group which may have a substituent; $v''$ represents an integer of 0 to 3; $q''$ represents an integer of 1 to 20; $t''$ represents an integer of 1 to 3; and $n''$ represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R''^{103}$ which may have a substituent, the same groups as the cyclic aromatic hydrocarbon group for $R^{101}$ described above are preferable. As the substituent, the same groups as those described above for substituting the cyclic aromatic hydrocarbon group for $R^{101}$ can be mentioned.

As the chain-like alkyl group for $R''^{101}$ which may have a substituent, the same groups as those described above for $R^{101}$ are preferable. As the chain-like alkenyl group for $R''^{103}$ which may have a substituent, the same groups as those described above for $R^{101}$ are preferable.

In the formula (b-2), $R^{104}$ and $R^{105}$ each independently represents an alkyl group of 1 to 10 carbon atoms or a fluorinated alkyl group of 1 to 10 carbon atoms, and may be mutually bonded to form a ring.

Each of $R^{104}$ and $R^{105}$ is preferably a linear or branched (fluorinated) alkyl group. The (fluorinated) alkyl group preferably has 1 to 10 carbon atoms, preferably 1 to 7, and more preferably 1 to 3. The smaller the number of carbon atoms of the (fluorinated) alkyl group for $R^{104}$ and $R^{105}$, the more the solubility in a resist solvent is improved.

Further, in the (fluorinated) alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the (fluorinated) alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

{Cation Moiety}

In formulae (b-1) and (b-2), $M'^{m+}$ represents an organic cation having a valency of m, preferably a sulfonium cation or a iodonium cation, and most preferably a cation represented by any one of general formulae (ca-1) to (ca-4) shown below.

[Chemical Formula 29]

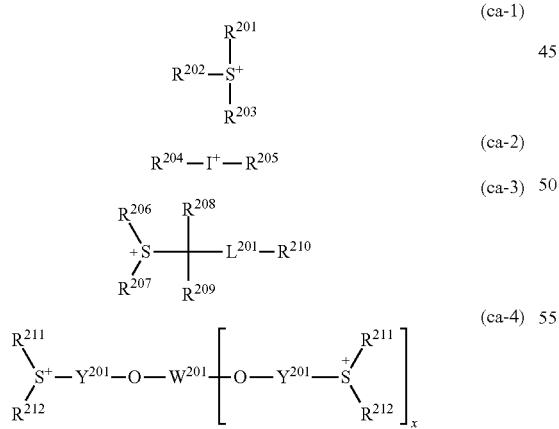

In the formulae, $R^{201}$ to $R^{207}$, $R^{211}$ and $R^{212}$ independently represents an aryl, group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an $-SO_2-$ containing cyclic group which may have a substituent; $L^{201}$ represents $-C(=O)-$ or $-C(=O)O-$; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$ and $R^{210}$ to $R^{212}$, an unsubstituted aryl group of 6 to 20 carbon atoms can be mentioned, and a phenyl group or a naphthyl group is preferable.

As the alkyl group for $R^{201}$ to $R^{207}$ and $R^{210}$ to $R^{212}$, a chain-like or cyclic alkyl group having 1 to 30 carbon atoms is preferable.

The alkenyl group for $R^{201}$ to $R^{207}$ and $R^{210}$ to $R^{212}$ preferably has 2 to 10 carbon atoms.

$R^{208}$ and $R^{209}$ is preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

As the $-SO_2-$ containing cyclic group for $R^{210}$ which may have a substituent, the same "$-SO_2-$ containing cyclic groups" as those described above for $Ra^{21}$ can be mentioned, and the group represented by the aforementioned general formula (a5-r-1) is preferable.

Examples of the substituent for $R^{201}$ to $R^{207}$ and $R^{210}$ to $R^{212}$ include an alkyl group, a halogen atom, a halogenated alkyl group, an oxo group (=O), a cyano group, an amino group, an aryl group and groups represented by general formulae (ca-r-1) to (ca-r-7) shown below.

[Chemical Formula 30]

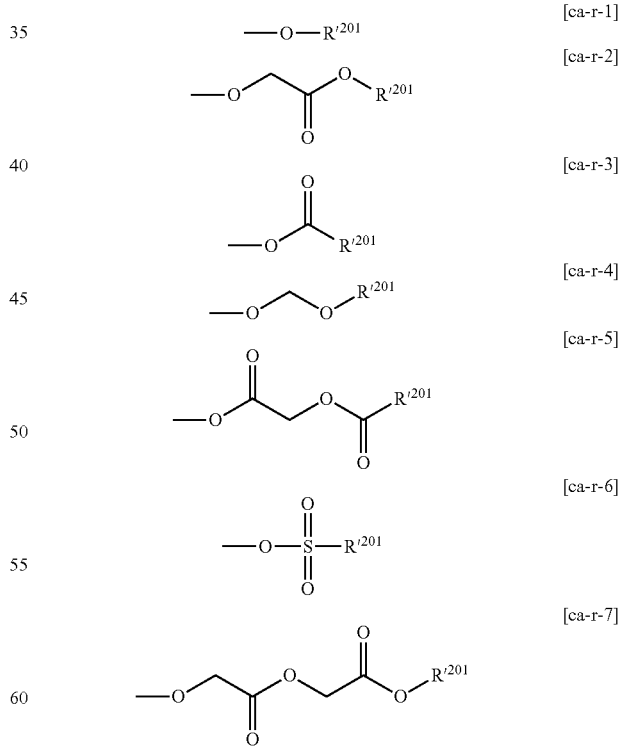

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ can be mentioned. As the cyclic group which may have a substituent and chain-like alkyl group which may have a substituent, the same groups as those described above for the group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms).

The ring containing the sulfur atom in the skeleton thereof is preferably a 3 to 10-membered ring, and most preferably a 5 to 7-membered ring.

Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for Ya$^{21}$ in the general formula (a2) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group and a group in which the divalent linking group has been bonded to another divalent linking group can be mentioned. The trivalent linking group for $W^{201}$ is preferably an arylene group combined with three carbonyl groups.

Specific examples of preferable cations represented by formula (ca-1) include cations represented by formulas (ca-1) to (ca-1-58) shown below.

[Chemical Formula 31]

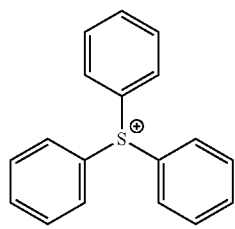

(ca-1-1)

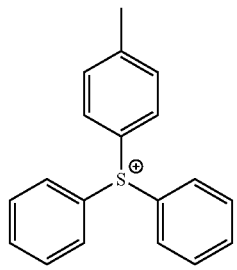

(ca-1-2)

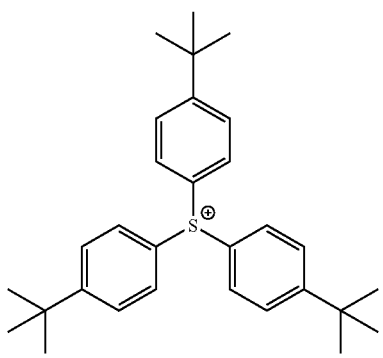

(ca-1-3)

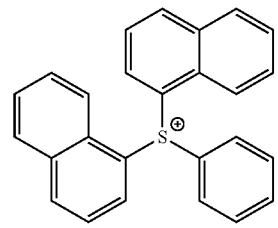

(ca-1-4)

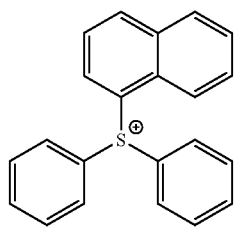

(ca-1-5)

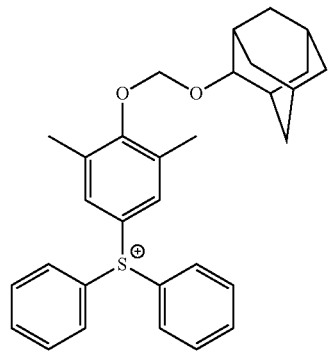

(ca-1-6)

(ca-1-7)
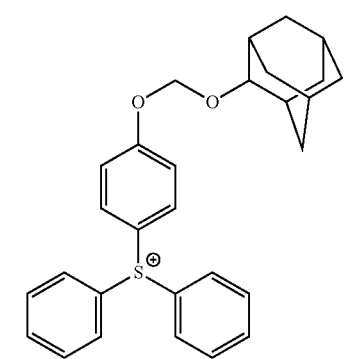
(ca-1-8)
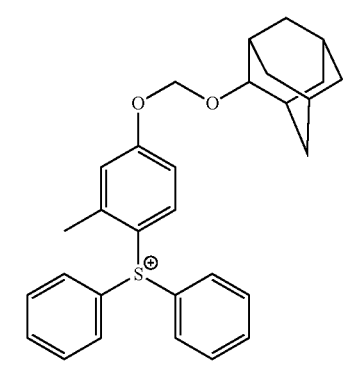
(ca-1-9)
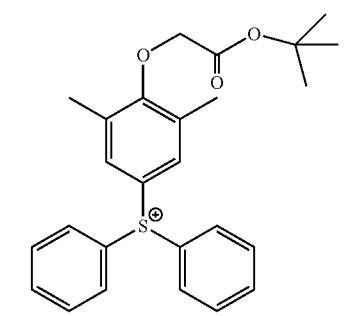
(ca-1-10)
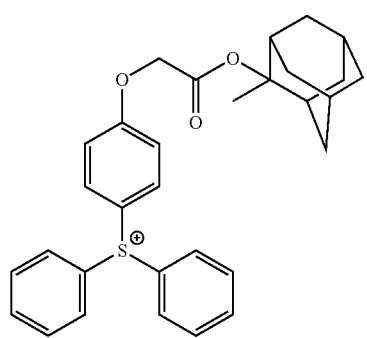
(ca-1-11)
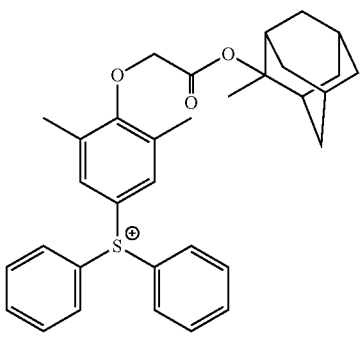
(ca-1-12)
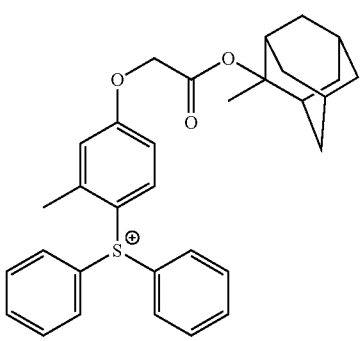
(ca-1-13)
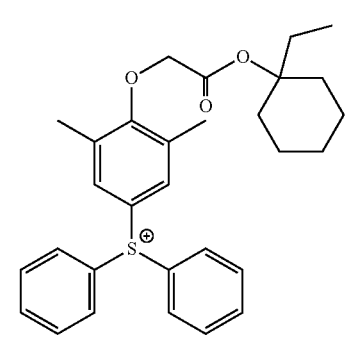
(ca-1-14)
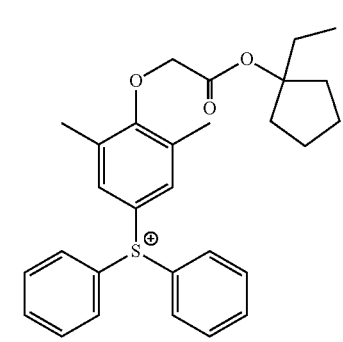
(ca-1-15)
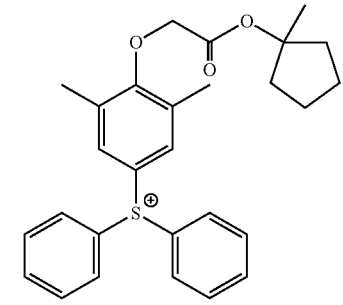

51
-continued
(ca-1-16)
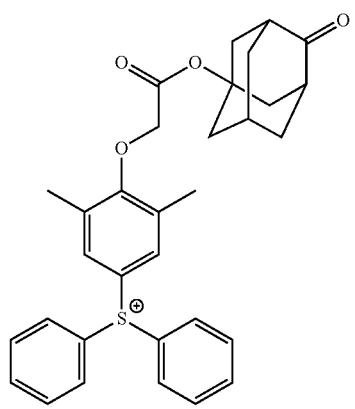
(ca-1-17)
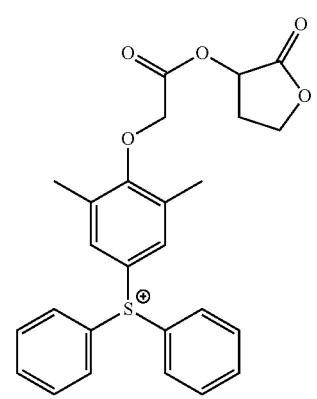
(ca-1-18)
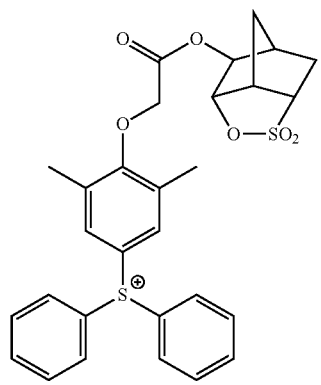
(ca-1-19)
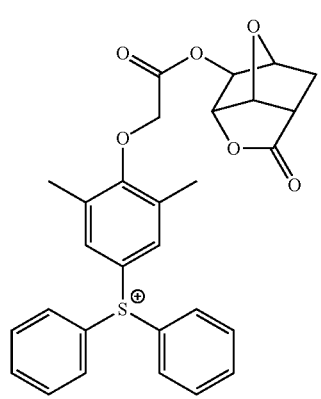
52
-continued
(ca-1-20)
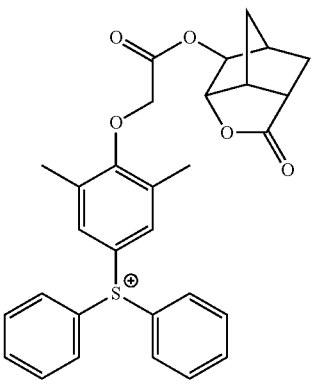
(ca-1-21)
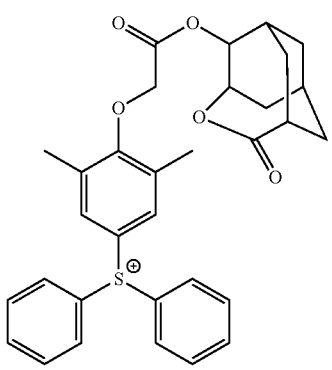
(ca-1-22)
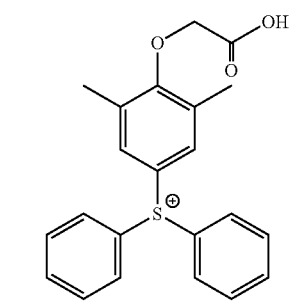
(ca-1-23)
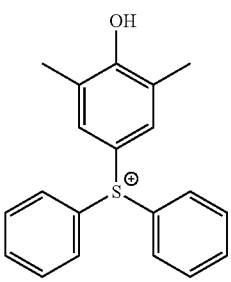
(ca-1-24)
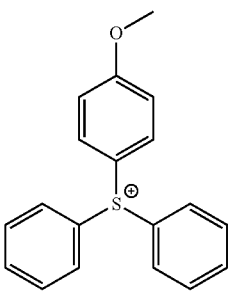

(ca-1-25)
(ca-1-26)
(ca-1-27)
(ca-1-28)
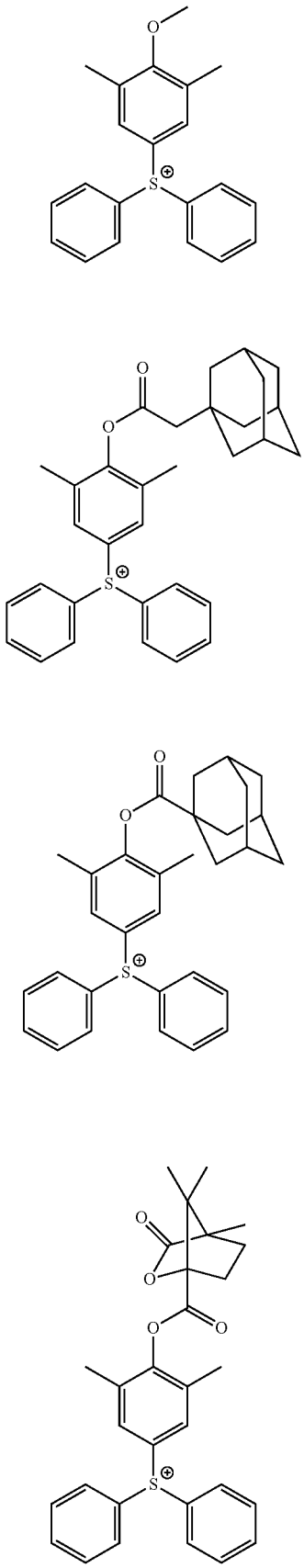
[Chemical Formula 32]
(ca-1-29)
(ca-1-30)
(ca-1-31)
(ca-1-32)
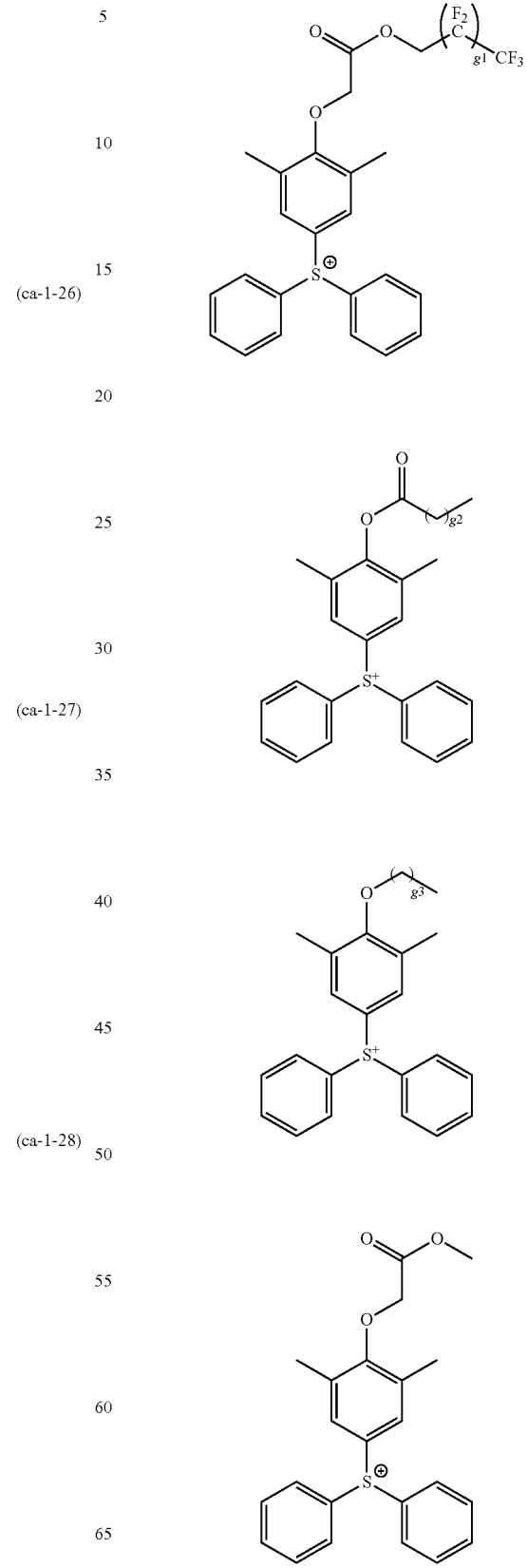

(ca-1-33)
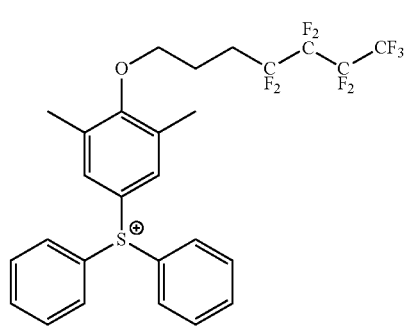
(ca-1-34)
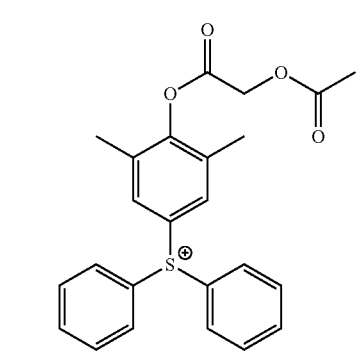
(ca-1-35)
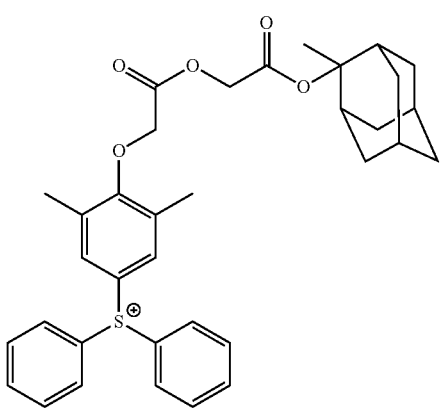
(ca-1-36)
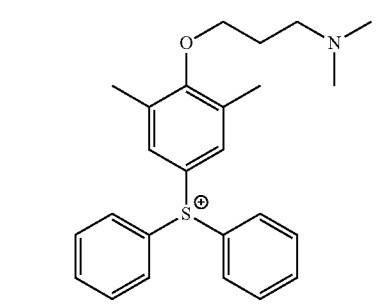
(ca-1-37)
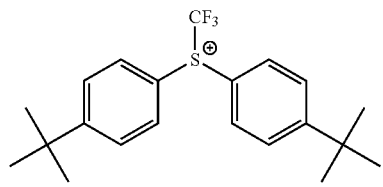
(ca-1-38)
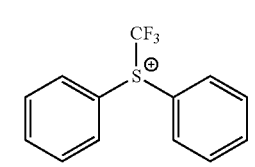
(ca-1-39)
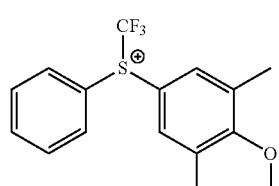
(ca-1-40)
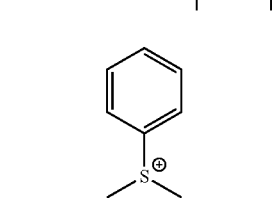
(ca-1-41)
(ca-1-42)
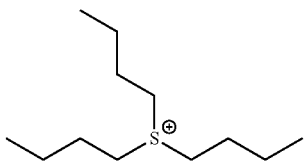
(ca-1-43)
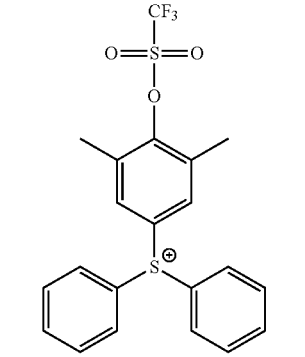
In the formulae, g1, g2 and g3 represent recurring numbers, wherein g1 is an integer of 1 to 5, g2 is an integer of 0 to 20, and g3 is an integer of 0 to 20.
[Chemical Formula 33]
(ca-1-44)
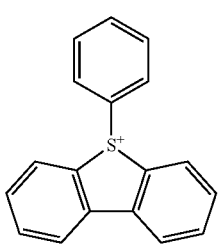

(ca-1-45)
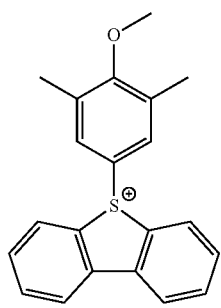
(ca-1-46)
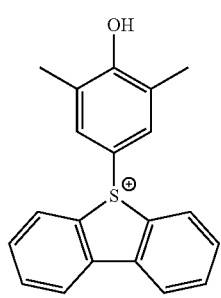
(ca-1-47)
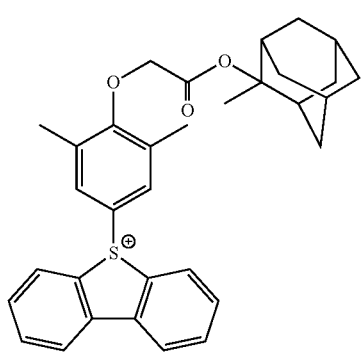
(ca-1-48)
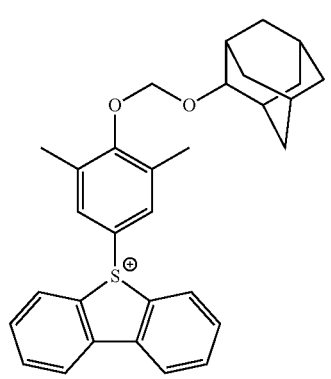
(ca-1-49)
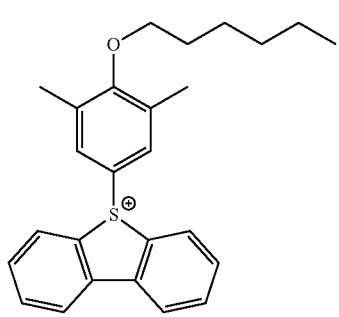
(ca-1-50)
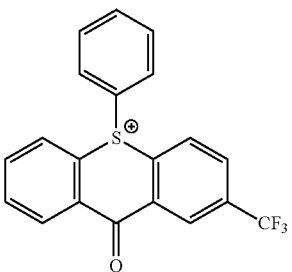
(ca-1-51)
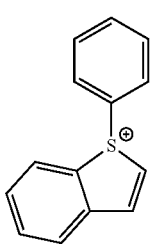
(ca-1-52)
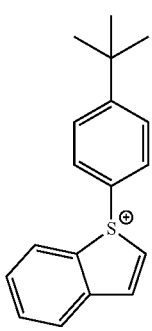
(ca-1-53)
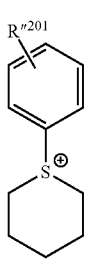
(ca-1-54)
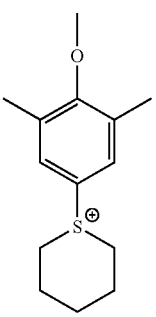

-continued

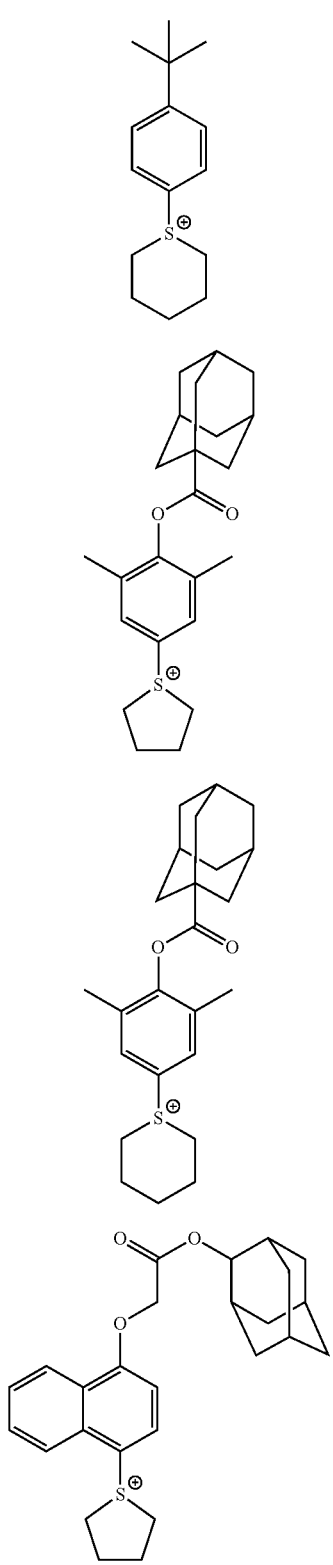

(ca-1-55)

(ca-1-56)

(ca-1-57)

(ca-1-58)

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by formula (ca-3) include cations represented by formulas (ca-3-1) to (ca-3-6) shown below.

[Chemical Formula 34]

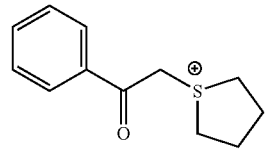

(ca-3-1)

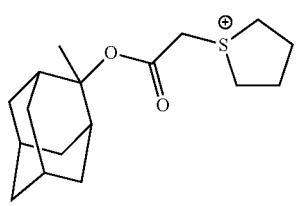

(ca-3-2)

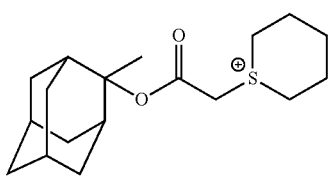

(ca-3-3)

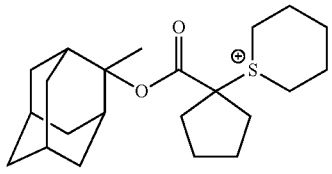

(ca-3-4)

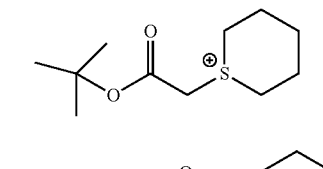

(ca-3-5)

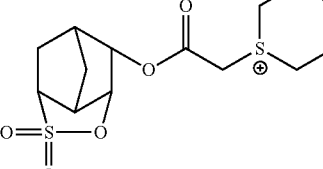

(ca-3-6)

Specific examples of preferable cations represented by formula (ca4) include cations represented by formulas (ca-4-1) and (ca-4-2) shown below.

[Chemical Formula 35]

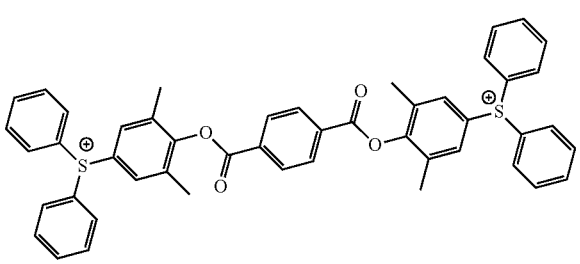

(ca-4-1)

-continued (ca-4-2)

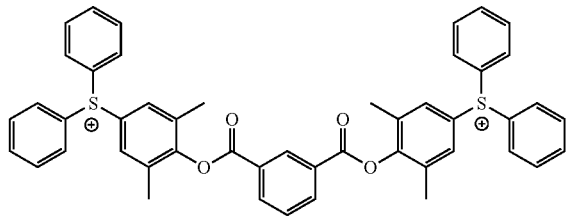

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Optional Components>
[Basic Compound (D)]

It is preferable that the resist composition of the present invention further includes a basic compound (D) (hereafter referred to as the component (D)) as an optional component.

In the present invention, the component (D) functions as an acid diffusion control agent, i.e., a quencher which traps the acid generated from the component (A), the component (B) described later (acid generator component which is optionally added) upon exposure. In the present invention, a "basic compound" refers to a compound which is basic relative to the component (A) or the component (B).

In the present invention, the component (D) is preferably a basic compound (D1) (hereafter, referred to as "component (D1)") which has a cation moiety and an anion moiety.

{Component (D1)}

The component (D1) is a basic compound composed of a cation moiety and an anion moiety. The basic compound traps acid (strong acid) generated from the component (A) and the component (B) by a salt exchange.

Specific examples of the component (D1) include compounds represented by general formula (d2) shown below.

[Chemical Formula 36]

(d2)

In the formula, $Rd^2$ represents a hydrocarbon group which may have a substituent, provided that, in formula (d2), the carbon atom adjacent to the S atom has no fluorine atom bonded thereto; and $M^{m+}$ represents an organic cation having a valency of m.

(Component (d2))
Anion Moiety

In formula (d2), $Rd^2$ represents a hydrocarbon group of 1 to 30 carbon atoms which may have a substituent.

The hydrocarbon group of 1 to 30 carbon atoms for $Rd^2$ which may have a substituent may be either an aliphatic hydrocarbon group or an aromatic hydrocarbon group, and is the same as defined for the cyclic group which may have a substituent, the alkyl group which may have a substituent and the alkenyl group which may have a substituent for $R^{101}$ in the aforementioned component (B).

Among these, as the hydrocarbon group for $Rd^2$ which may have a substituent, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent, and the same substituents as those described above for $R^{101}$ in the aforementioned component (B) can be used. However, in $Rd^2$, the carbon adjacent to the S atom within $SO_3^-$ has no fluorine atom as a substituent. By virtue of $SO_3^-$ having no fluorine atom adjacent thereto, the anion of the component (d2) becomes an appropriately weak acid anion, thereby improving the quenching ability of the component (d2).

Specific examples of preferable anion moieties for the component (d2) are shown below.

[Chemical Formula 37]

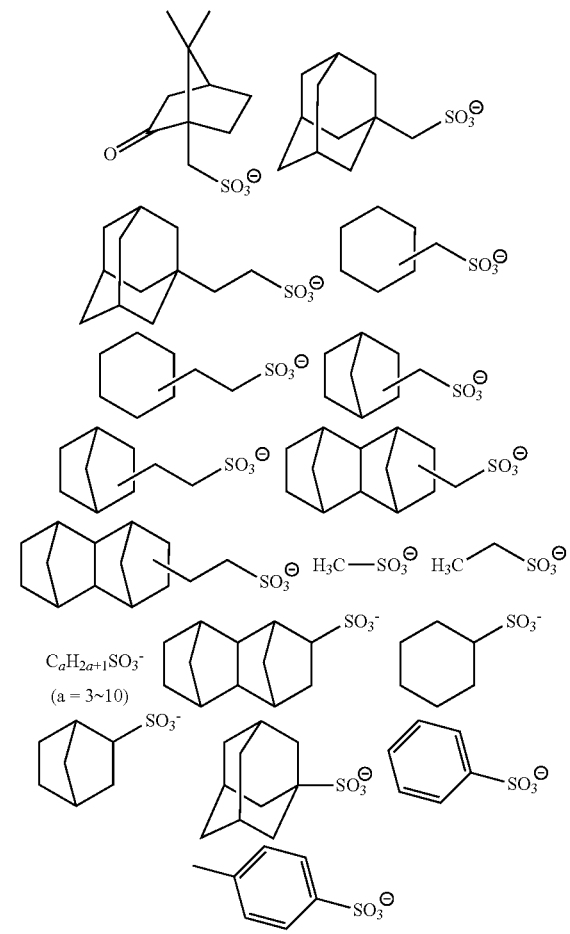

Cation Moiety

In formula (d2), $M^{m+}$ is an organic cation having a valency of m, and is the same as defined for the cation in the aforementioned component (B). Among these, a sulfonium cation or a iodonium cation is preferable, and a cation moiety represented by any one for the aforementioned formulae (ca-1-1) to (ca-1-57) is preferable.

As the component (d2), one type of compound may be used, or two or more types of compounds may be used in combination.

<Optional Components>
[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

For imparting water repellency to the resist film, the resist composition of the present invention preferably includes a fluorine-containing resin component (F) (hereafter, referred to as "resin component (F)") which has a structural unit (f) (hereafter, referred to as "structural unit (f)") containing a fluorine atom. As the resin component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

The structural unit (f) is preferably a structural unit represented by general formula (f-1) shown below.

[Chemical Formula 38]

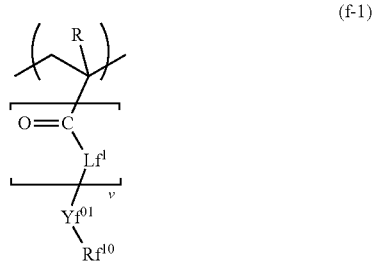

(f-1)

In the formulae, R represents a hydrogen atom, an alkyl group of 1 to 5 carbon atoms or a halogenated alkyl group of 1 to 5 carbon atoms; $Lf^1$ represents O or NH; $Yf^{01}$ represents a single bond or a divalent linking group, and $Rf^{10}$ represents an organic group, provided that at least one of $Yf^{01}$ and $Rf^{10}$ has a fluorine atom; and v represents 0 or 1.

In formula (f-1), R represents a hydrogen atom, an alkyl group of 1 to 5 carbon atoms or a halogenated alkyl group of 1 to 5 carbon atoms. The alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be used as the substituent bonded to the carbon atom on the α-position. Among these, as R, a hydrogen atom or a methyl group is preferable.

In formula (f-1), $Lf^1$ represents O (oxygen atom) or NH, and preferably O (oxygen atom).

In formula (f-1)$_m$ v represents 0 or 1. When v represents 0, —C(=O)—$Lf^1$— in the formula becomes a single bond.

In formula (f-1), $YR^{01}$ represents a single bond or a divalent linking group.

As preferable examples of the divalent linking group for $Yf^{01}$, a divalent hydrocarbon group which may have a substituent, and a divalent linking group containing a hetero atom can be given. However, the divalent linking group for $Yf^{01}$ does not have an acid decomposable group in the structure thereof. The acid decomposable group is the same as defined for the "acid decomposable group that exhibits increased polarity by the action of acid" in the aforementioned structural unit (a1).

(Divalent Hydrocarbon Group which May have a Substituent)

The divalent hydrocarbon group may be an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, and still more preferably 1 to 5.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent (a group or atom other than hydrogen) which substitutes the hydrogen atom. Examples of the substituent include a fluorine atom, a fluorinated alkyl group of 1 to 5 carbon atoms, and an oxo group (=O).

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be polycyclic or monocyclic. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic aliphatic hydrocarbon group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent (a group or atom other than hydrogen) which substitutes the hydrogen atom. Examples of substituents include an alkyl group, an alkoxy group, a halogen atom, a halogenated alkyl group, a hydroxyl group and an oxo group (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

The aromatic group as the divalent hydrocarbon group is a divalent hydrocarbon group having at least one aromatic ring, and may have a substituent.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic group as the divalent hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

The aromatic group may or may not have a substituent. For example, the hydrogen atom bonded to the aromatic ring within the aromatic group may be substituted with a substituent. Examples of substituents include an alkyl group, an alkoxy group, a halogen atom, a halogenated alkyl group, a hydroxyl group and an oxo group (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

(Divalent Linking Group Containing a Hetero Atom)

With respect to a "divalent linking group containing a hetero atom", a hetero atom is an atom other than carbon and hydrogen, and examples thereof include an oxygen atom, a nitrogen atom, a sulfur atom, a halogen atom and a silicon atom.

Specific examples of the divalent linking group containing a hetero atom include non-hydrocarbon linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, =N— and —SiH$_2$—O—; and a combination of any one of these non-hydrocarbon linking groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

Among the above examples, H within —NH— of —C(=O)—NH—, —NH—, —NH—C(=NH)— and

—SiH$_2$—O— may be substituted with a substituent such as an alkyl group or an acyl group. The substituent preferably has 1 to 10 carbon atoms, more preferably 1 to 8 carbon atoms, and most preferably 1 to 5 carbon atoms.

Examples of the combination of a non-hydrocarbon divalent linking group with a divalent hydrocarbon group as the divalent linking group include —Y$^{21}$—O—Y$^{22}$—, —[Y$^{21}$—C(=O)—O]$_{m'}$—Y$^{22}$—, —Y$^{21}$—O—C(=O)—Y$^{22}$— (provided that Y$^{21}$ and Y$^{22}$ each independently represents a divalent hydrocarbon group which may have a substituent, O represents an oxygen atom, and m' represents an integer of 0 to 3), —C(=O)—NH—Y$^{22}$—and —[Y$^{23}$—O]$_{n'}$—(provided that Y$^{23}$ represents an alkylene group, O represents an oxygen atom, and n' represents an integer of 1 or more).

In formula —Y$^{21}$—O—Y$^{22}$—, —[Y$^{21}$—C(=O)—O]$_{m'}$—Y$^{22}$— or —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent".

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In formula —[Y$^{21}$—C(=O)—O]$_{m'}$—Y$^{22}$—, m' represents an integer of 0 to 3, preferably an integer of 0 to 2, more preferably 0 or 1, and most preferably 1.

Namely, it is most preferable that —[Y$^{21}$—C(=O)—O]$_{m'}$—Y$^{22}$— represents —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the alkylene group for Y$^{23}$ in the above formula —[Y$^{23}$—O]$_{n'}$—, an alkylene group of 1 to 4 carbon atoms is preferable.

Among these, as Yf$^{01}$, a single bond or a divalent linking group containing a hetero atom is preferable, a single bond, a group represented by the aforementioned formula —Y$^{21}$—O—Y$^{22}$—, a group represented by the aforementioned formula —[Y$^{21}$—C(=O)—O]$_{m'}$—Y$^{22}$—, a group represented by the aforementioned formula —C(=O)—O—Y$^{22}$— or a group represented by the aforementioned formula —Y$^{21}$—O—C(=O)—Y$^{22}$— is more preferable, a single bond or —C(=O)—O—Y$^{22}$— is most preferable.

As Yf$^{01}$, a single bond or a divalent linking group containing a hetero atom is preferable, and a single bond, a divalent linking group containing —C(=O)—O— or a divalent linking group containing —O— is more preferable.

In the case where v represents 0, as the divalent linking group for Yf$^{01}$, a divalent aromatic hydrocarbon group which may have a substituent, a combination of a divalent aromatic hydrocarbon group which may have a substituent with a divalent linking group containing —O—C(=O)—, a divalent alicyclic group which may have a substituent, or a combination of a divalent alicyclic group which may have a substituent with a divalent linking group containing —O— is preferable.

More specifically, a group in which 1 hydrogen atom has been removed from a phenyl group or a naphthyl group which may have a substituent; a combination of a group in which 1 hydrogen atom has been removed from a phenyl group or a naphthyl group which may have a substituent with —O—C(=O)—; a combination of a group in which 1 hydrogen atom has been removed from a phenyl group or a naphthyl group which may have a substituent, —O—C(=O)— and a linear alkylene group; a group in which 2 hydrogen atoms have been removed from a cycloalkane which may have a substituent; and a combination of a group in which 2 hydrogen atoms have been removed from a cycloalkane which may have a substituent with —O— are most preferable.

Alternatively, in the case where v represents 1, as the divalent linking group for Yf$^{01}$, a combination of a divalent hydrocarbon group which may have a substituent with a divalent linking group containing —C(=O)—O—, a combination of a divalent aromatic hydrocarbon group with a divalent linking group containing —O—, or a combination of a divalent chain-like hydrocarbon group which may have a substituent with a divalent linking group containing —O—C(=O)— is preferable; and a combination of a divalent chain-like hydrocarbon group or aromatic hydrocarbon group which may have a substituent with —C(=O)—O—, a combination of a divalent chain-like hydrocarbon group or aromatic hydrocarbon group which may have a substituent with —O—C(=O)—, a combination of a divalent aromatic hydrocarbon group which may have a substituent, —O— and a divalent chain-like hydrocarbon group which may have a substituent, or a combination of a divalent chain-like hydrocarbon group which may have a substituent, —O—C(=O)— and a divalent chain-like hydrocarbon group which may have a substituent is more preferable.

In the case where Yf$^{01}$ represents a divalent linking group, Yf$^{01}$ may or may not have a fluorine atom. In the case where YR$^{01}$ represents a single bond, or in the case where Yf$^{01}$ represents a divalent linking group having no fluorine atom, the organic group for Rf$^{10}$ described later has a fluorine atom.

In formula (f-1), Rf$^{10}$ represents an organic group. The organic group for Rf$^{10}$ may be an organic group having a fluorine atom, or an organic group having no fluorine atom. However, in the case where Yf$^{01}$ is a single bond, or in the case where Yf$^{01}$ is a divalent linking group having no fluorine atom, the organic group for Rf$^{10}$ has a fluorine atom.

An "organic group having a fluorine atom" refers to an organic group in which part or all of the hydrogen atoms have been substituted with a fluorine atom.

As an example of an organic group represented by Rf$^{10}$ which may have a fluorine atom, a hydrocarbon group which may have a fluorine atom can be given. The hydrocarbon group which may have a fluorine atom may be either an aliphatic hydrocarbon group or an aromatic hydrocarbon group.

Examples of the aliphatic hydrocarbon group for Rf$^{10}$ include a linear, branched or cyclic alkyl group.

The linear or branched alkyl group preferably has 1 to 15 carbon atoms, more preferably 1 to 10 carbon atoms, still more preferably 1 to 8 carbon atoms, and most preferably 1 to 5 carbon atoms.

The cyclic alkyl group (alicyclic group) preferably has 4 to 15 carbon atoms, more preferably 4 to 10 carbon atoms, still more preferably 6 to 10 carbon atoms, and most preferably 5 to 7 carbon atoms.

The aromatic hydrocarbon group for Rf$^{10}$ preferably has 5 to 30 carbon atoms, more preferably 5 to 20, still more preferably 6 to 15, and most preferably 6 to 12, and a phenyl group or a naphthyl group is particularly desirable.

These alkyl groups and aromatic hydrocarbon groups are preferably substituted with a fluorine atom. The alkyl group or the aromatic hydrocarbon group preferably has 25% or more of the hydrogen atoms substituted with a fluorine atom, more preferably 50% or more of the hydrogen atoms substituted with a fluorine atom, and may even have all of the hydrogen atoms substituted with a fluorine atom.
Further, these alkyl groups and aromatic hydrocarbon groups may be substituted with a substituent other than a fluorine atom. Examples of the substituent other than a fluorine atom include a hydroxy group, a chlorine atom; a bromine atom, an iodine atom, an alkoxy group of 1 to 5 carbon atoms and a fluorinated alkoxy group of 1 to 5 carbon atoms. Further, the cyclic group or the aromatic hydrocarbon group may be substituted with an alkyl group of 1 to 5 carbon atoms. The alkyl group of 1 to 5 carbon atoms is the same as the alkyl group of 1 to 5 carbon atoms which can be used as the substituent for the α-position.

Among the structural units represented by general formula (f-1), specific examples of preferable structural unit containing a fluorine atom include structural units represented by general formulae (f-1-1) to (f-1-5) shown below.

[Chemical Formula 39]

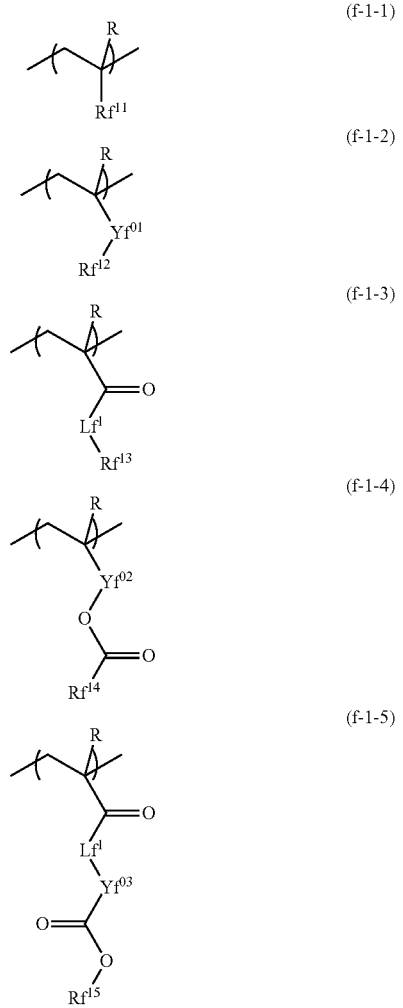

(f-1-1)
(f-1-2)
(f-1-3)
(f-1-4)
(f-1-5)

In the formulae, R is the same as defined above; $Rf^{11}$, $Rf^{12}$ and $Rf^{13}$ each independently represents an organic group having a fluorine atom; $Yf^{01}$ and $Lf^1$ are the same as defined above; $Yf^{02}$ and $Yf^{03}$ each independently represents a divalent linking group; $Rf^{14}$ and $Rf^{15}$ each independently represents an organic group having a fluorine atom; provided that at least one of $Yf^{02}$ and $Rf^{14}$ has a fluorine atom, and at least one of $Yf^{03}$ and $Rf^{15}$ has a fluorine atom.

In formula (f-1-1), $Rf^{11}$ represents an organic group having a fluorine atom, preferably an aromatic hydrocarbon group having a fluorine atom, a combination of an alkyl group substituted by a fluorine atom and a hydroxy group with an aromatic hydrocarbon group which may have a fluorine atom, or a combination of an alkyl group substituted by a fluorine atom and a fluorinated alkoxy group of 1 to 5 carbon atoms with an aromatic hydrocarbon group.

Examples of the aromatic hydrocarbon group having a fluorine atom include the aromatic hydrocarbon groups for $Rf^{10}$ in which part or all of the hydrogen atoms have been substituted with a fluorine atom.

In formula (f-1-2), $YR^{01}$ represents a single bond or a divalent linking group, and is the same as defined for $Yf^{01}$ above.

$Rf^{12}$ represents an organic group having a fluorine atom, preferably a chain-like alkyl group substituted with a fluorine atom and a hydroxy group, or a combination of a cyclic alkyl group with an alkyl group substituted with a fluorine atom and a hydroxy group.

The chain-like alkyl group and the cyclic alkyl group are the same as defined for the aliphatic hydrocarbon group (linear, branched or cyclic alkyl group) for $Rf^{10}$.

In formula (f-1-3), $Lf^1$ is the same as defined above.
$Rf^{13}$ represents an organic group having a fluorine atom, preferably a chain-like alkyl group having a fluorine atom, a cyclic alkyl group having a fluorine atom, an aromatic hydrocarbon group having a fluorine atom, a chain-like alkyl group substituted with a fluorine atom and a hydroxy group, an aromatic hydrocarbon group substituted with a fluorine atom and a hydroxy group, or a combination of a cyclic alkyl group with an alkyl group substituted with a fluorine atom and a hydroxy group.

Examples of the cyclic group having a fluorine atom and the aromatic hydrocarbon group having a fluorine atom include the cyclic groups and the aromatic hydrocarbon groups for $Rf^{10}$ in which part or all of the hydrogen atoms have been substituted with a fluorine atom.

In formula (f-1-4), $Yf^{02}$ represents a divalent linking group, and is the same as defined for the divalent linking group for $Yf^{01}$ above.

Among these, as $Yf^{02}$, a divalent aromatic hydrocarbon group which may have as substituent is preferable, and a group in which one hydrogen atom has been removed from a phenyl group or a naphthyl group which may have a substituent is preferable.

As the substituent, a fluorine atom or an alkoxy group of 1 to 5 carbon atoms is preferable. In the case where $Yf^{02}$ has no fluorine atom, $Rf^{14}$ has a fluorine atom.

In formula (f-1-4), $Rf^{14}$ represents an organic group which may have a fluorine atom, and is the same as defined for the organic group represented by $Rf^{10}$. As $Rf^{14}$, a linear or branched alkyl group which may have a substituent is preferable, and the alkyl group preferably has 1 to 5 carbon atoms.

In formula (f-1-5), $Lf^1$ is the same as defined above.
$Yf^{03}$ represents a divalent linking group, and is the same as defined for the divalent linking group for $Yf^{01}$ above.

Among these, as $Yf^{03}$, a divalent aliphatic hydrocarbon group which may have a substituent, a divalent aromatic hydrocarbon group which may have a substituent, an ether bond (—O—), an ester bond (—C(=O)—O—, —O—C(=O)—) or a combination thereof is preferable.

As the substituent, a fluorine atom or an alkoxy group of 1 to 5 carbon atoms is preferable.

In the divalent aliphatic hydrocarbon group and the divalent aromatic hydrocarbon group for $Yf^{o3}$, a carbon atom constituting the hydrocarbon group may be substituted with an oxygen atom or a nitrogen atom.

In the case where $Yf^{o3}$ has no fluorine atom, $Rf^{15}$ has a fluorine atom. In formula (f-1-5), $Rf^{15}$ represents an organic group which may have a fluorine atom, and is the same as defined for $Rf^{14}$ above.

Specific examples of the structural units represented by formulae (f-1-1) to (f-1-5) are shown below. In the formulae, $R^{\beta}$ represents a hydrogen atom or a methyl group.

[Chemical Formula 40]

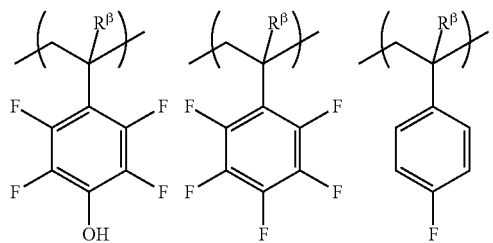

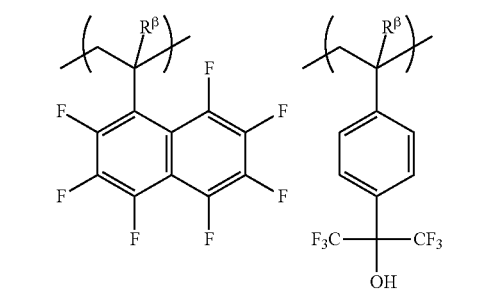

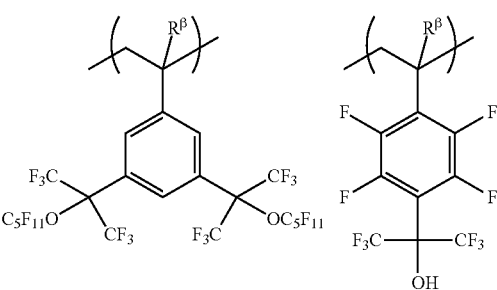

[Chemical Formula 41]

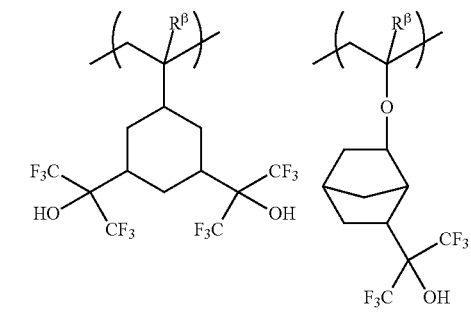

[Chemical Formula 42]

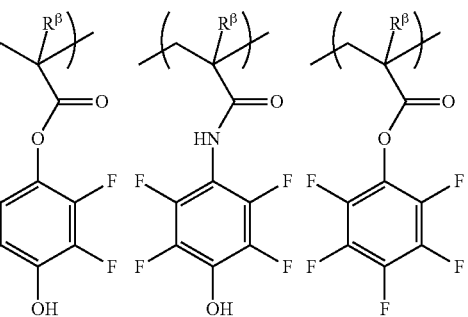

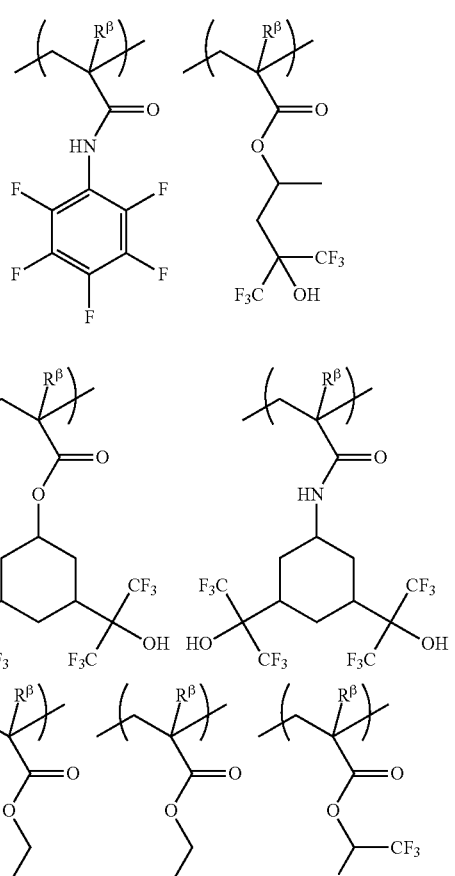

[Chemical Formula 43]

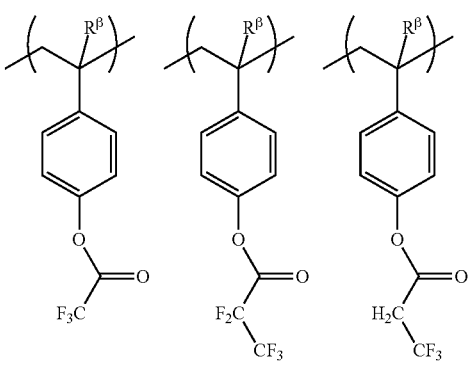

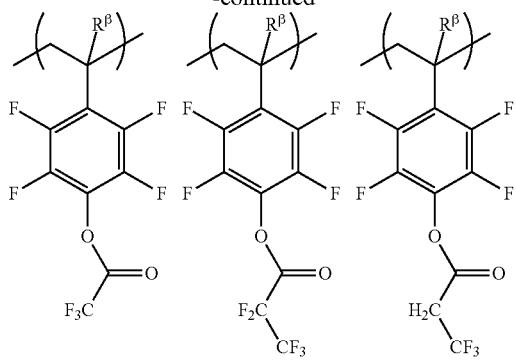
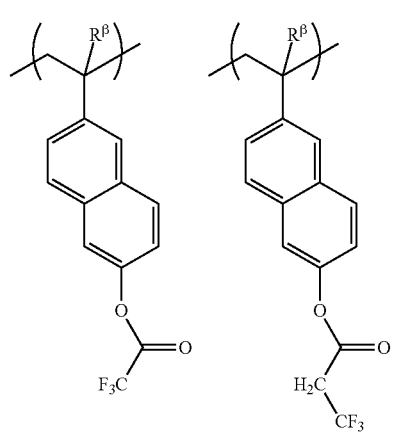
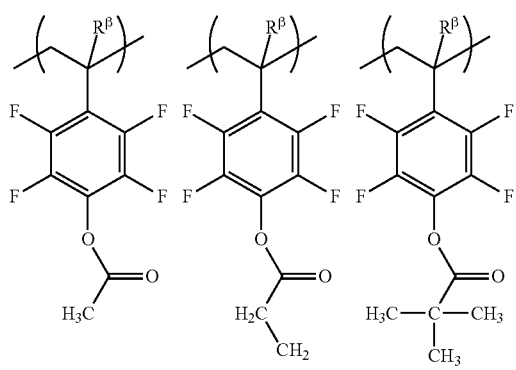
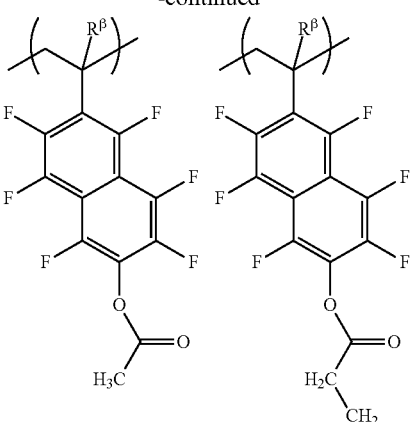
[Chemical Formula 44]
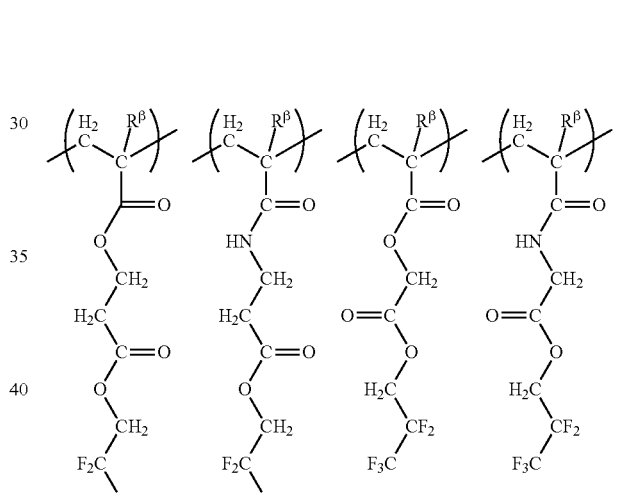
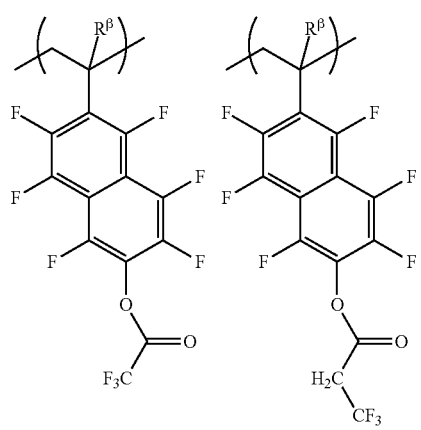
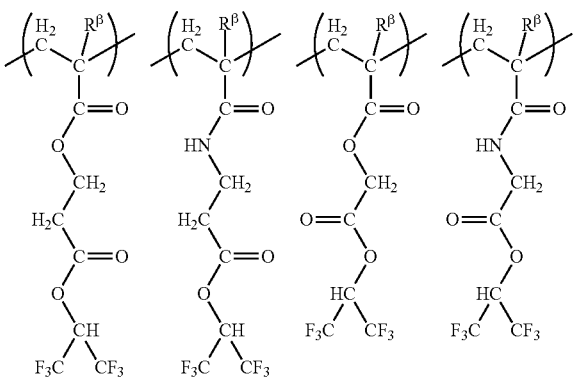

[Chemical Formula 45]
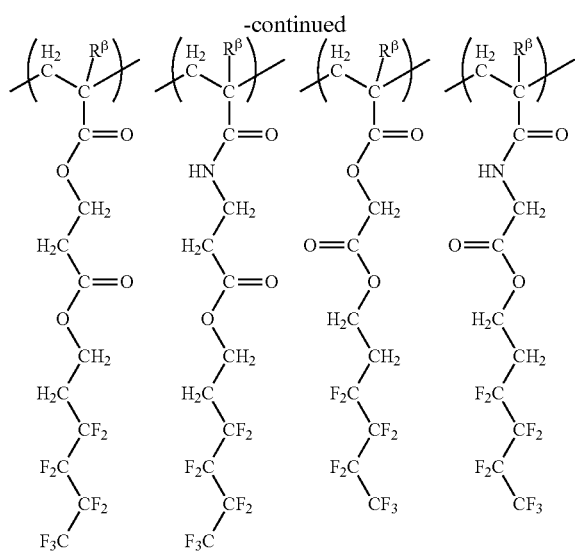
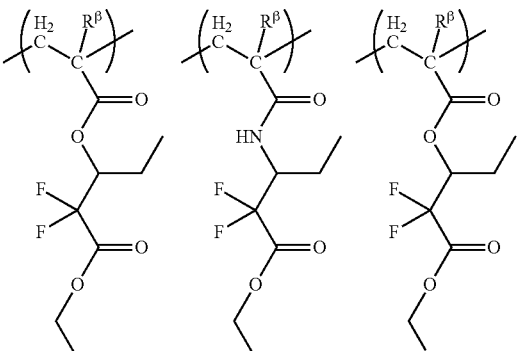
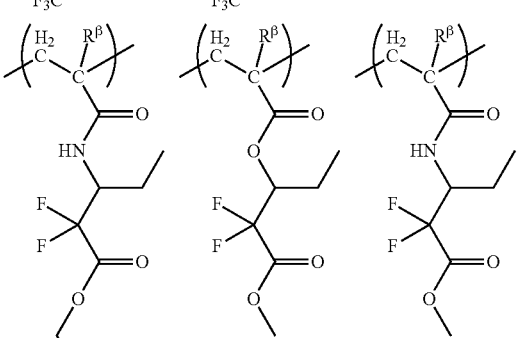
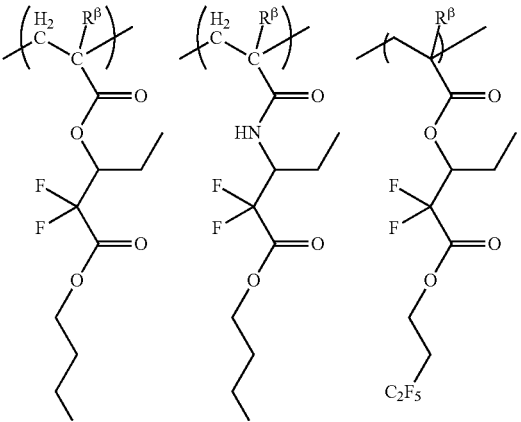
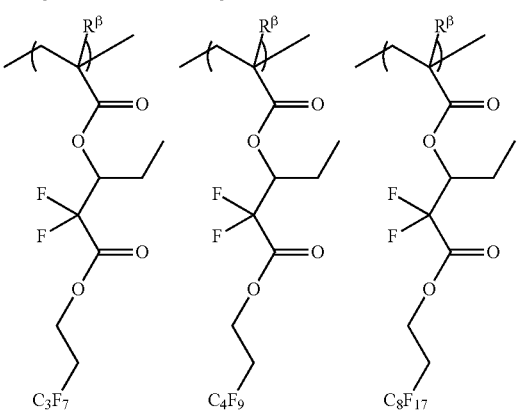

77
-continued
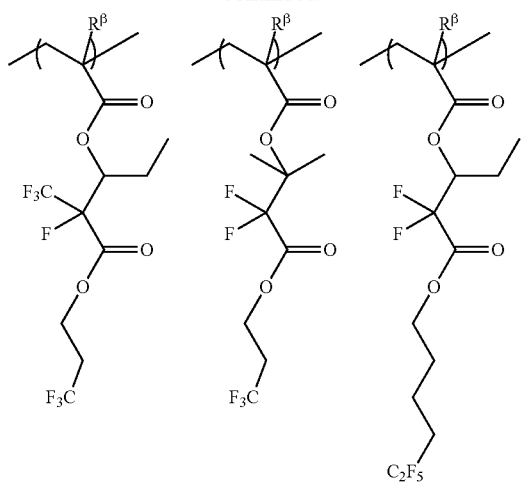
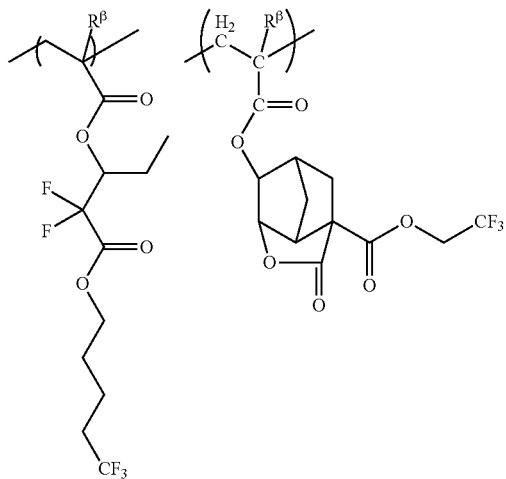
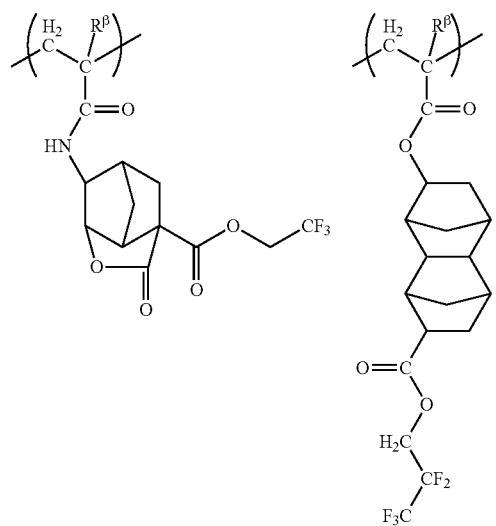
78
-continued
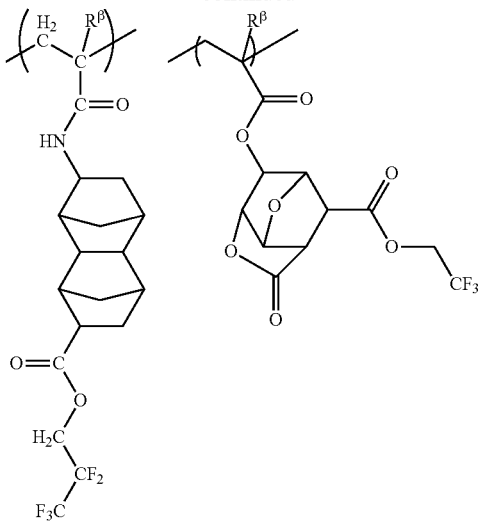
[Chemical Formula 46]
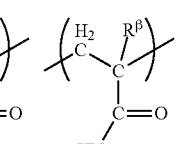
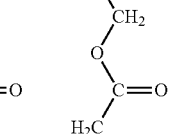
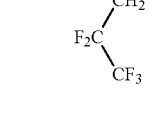
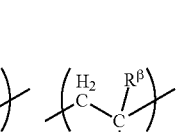
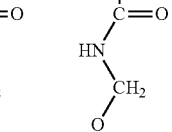
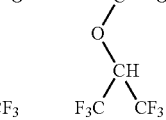

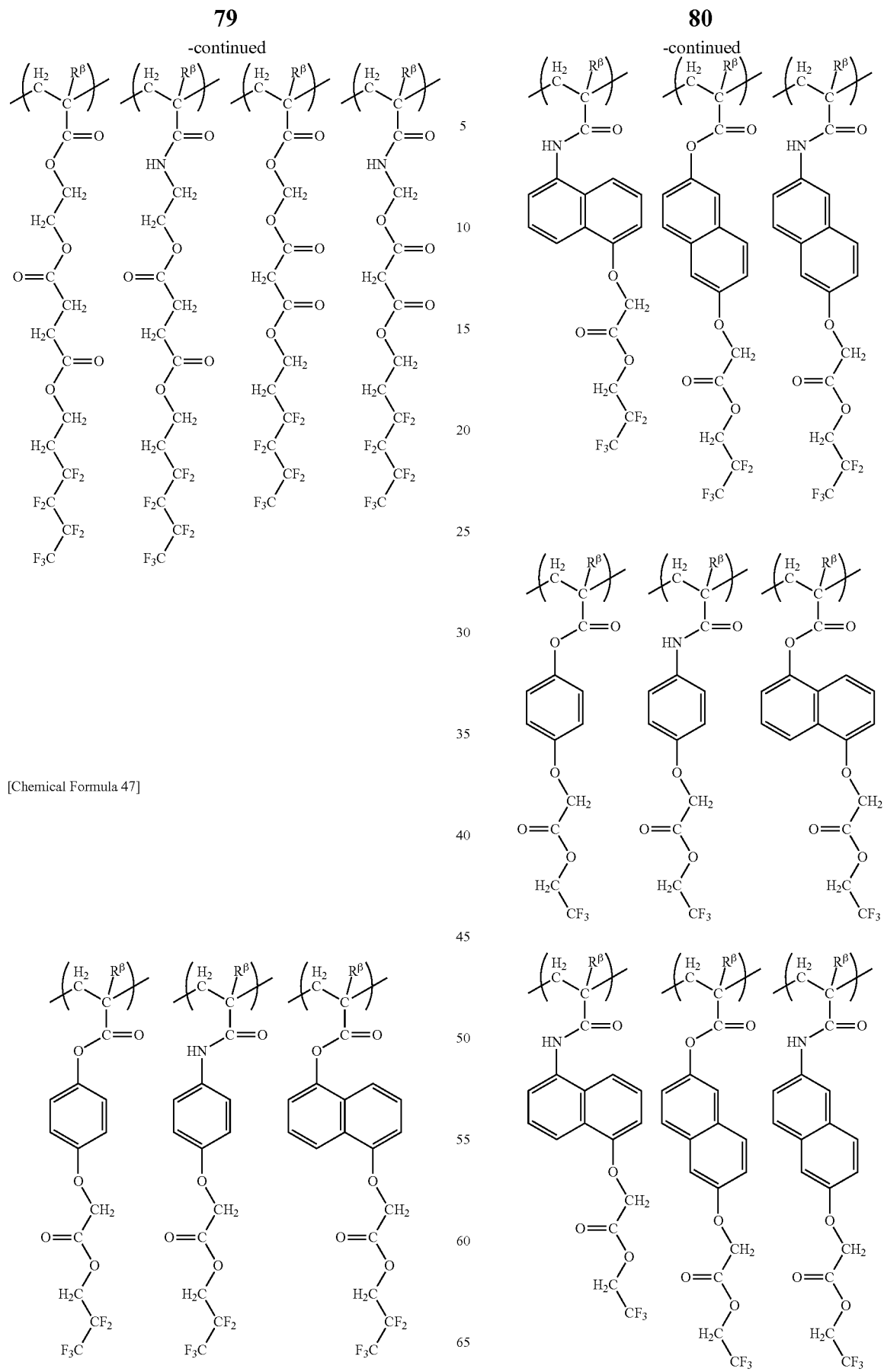
[Chemical Formula 47]

[Chemical Formula 48]

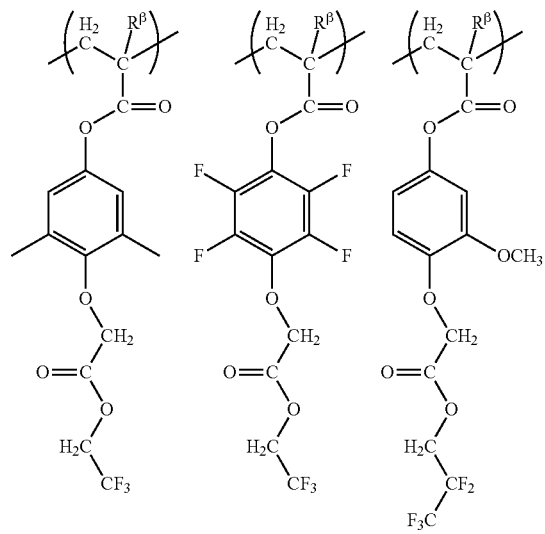

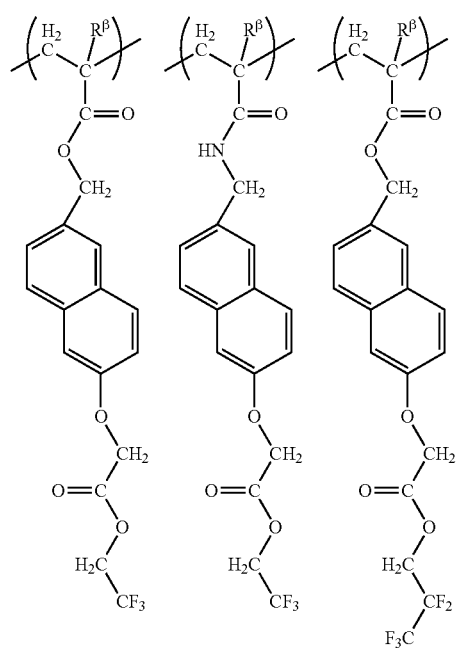

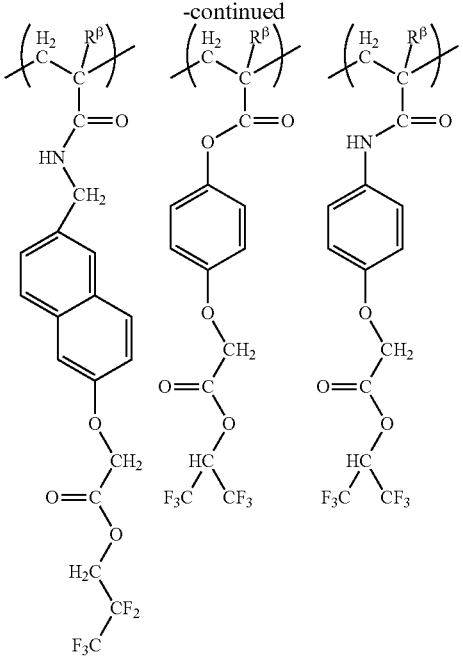

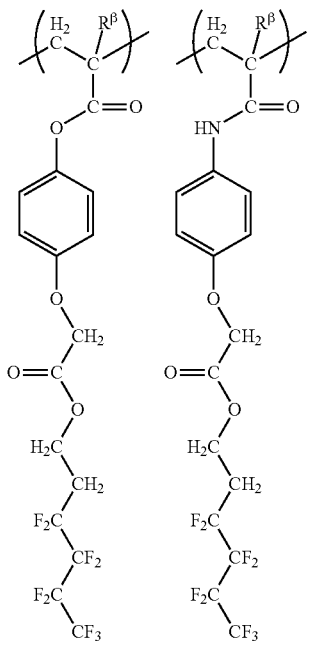

As the structural unit (f) having a fluorine atom, at least one member selected from the group consisting of structural units represented by any one of the aforementioned formulae (f-1-1) to (f-1-5) is preferable.

Among these, in terms of achieving an excellent water repellency on a surface of a resist film, a structural unit represented by the aforementioned formula (f-1-3) or (f-1-5) is more preferable.

In the present invention, the resin component (F) may contain a structural unit (f1) (hereafter, referred to as "structural unit (f1)") which has a fluorine atom and a base decomposable group.

Examples of the base decomposable group for the structural unit (f1) include groups represented by formulae (f1-r-1) to (f1-r-4) shown below.

[Chemical Formula 49]

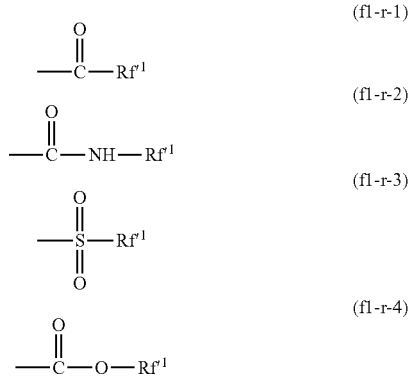

In the formulae, each $Rf^1$ independently represents an organic group which may have a fluorine atom.

In formulae (f1-r-1) to (f1-r-4), $Rf^1$ is the same as defined for the organic group (which may have a fluorine atom) for $Rf^{14}$ or $Rf^{15}$ above.

The structural unit (f1) is not particularly limited as long as it has a fluorine atom and a base decomposable group, and examples thereof include the aforementioned structural unit (f) which has a group represented by any one of formulae (f1-r-1) to (f1-r-4) above. Among these, a structural unit represented by general formula (f1-1) or (f1-2) shown below is preferable.

[Chemical Formula 50]

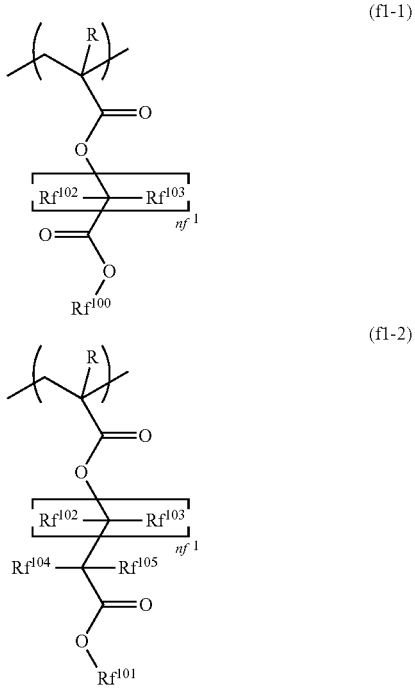

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; $Rf^{104}$ and $Rf^{105}$ each independently represents a fluorine atom or a fluorinated alkyl group of 1 to 5 carbon atoms, provided that $Rf^{104}$ and $Rf^{105}$ may be the same or different;

$Rf^{100}$ represents an organic group having a fluorine atom; and $Rf^{101}$ represents an organic group which may have a fluorine atom.

In the formulae, R is the same as defined above. As R, a hydrogen atom or a methyl group is preferable.

In the formulae, examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, a hydrogen atom, a fluorine atom, a methyl group or an ethyl group is more preferable, and a hydrogen atom is still more preferable.

In formula (f1-2), as $Rf^{104}$ and $Rf^{105}$, a fluorine atom or a trifluoromethyl group is preferable.

In the formulae, $nf^1$ represents an integer of 1 to 5, preferably an integer of 1 to 3, and more preferably 1 or 2.

In formula (f1-1), $Rf^{100}$ is the same as defined for the aforementioned organic group having a fluorine atom, and is preferably a hydrocarbon group containing a fluorine atom. The hydrocarbon group may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{100}$, a fluorinated hydrocarbon group of 1 to 6 carbon atoms is particularly desirable, and —$CH_2$—$CF_3$, —$CH_2$—$CF_2$—$CF_3$, —$CH(CF_3)_2$, —$CH_2$—$CH_2$—$CF_3$, —$CH_2$—$CH_2$—$CF_2$—$CF_3$, —$CH_2$ $CH_2$—$CF_2$—$CF_2$—$CF_3$ or —$CH_2$ $CH_2$—$CF_2$—$CF_2$ $CF_2$—$CF_3$ is most preferable.

In formula (f1-2), $Rf^{101}$ is the same as defined for the aforementioned organic group which may have a fluorine atom, and the same groups as those described above for $Rf^{100}$ can be give as preferable examples. Other examples include a methyl group, —$CH_2$—$CH_2$—$C_8F_{17}$, —$CH_2$—$CH_2$—$CH_2$—$CF_3$, —$CH_2$—$CH_2$—$CH_2$—$C_2F_5$ and —$CH_2$—$CH_2$—$CH_2$—$CH_2$—$CF_3$.

The resin component (F) may contain the aforementioned structural unit (a1).

Specific examples of the resin component (F) include a polymer having a structural unit (f) represented by the aforementioned formulae (f-1-1) to (f-1-5), and preferably a polymer having a structural unit (f1) represented by the aforementioned general formula (f1-1) or (f1-2). As such a polymer, a homopolymer consisting of a structural unit (f) or (f1); a copolymer of the aforementioned structural unit (a1) and a structural unit selected from a structural unit (f) represented by any one of the aforementioned formulae (f1-1) to (f1-5) or a structural unit (f1) represented by the aforementioned general formula (f1-1) or (f1-2); or a copolymer of the aforementioned structural unit (a1), the aforementioned structural unit (a2) and a structural unit selected from a structural unit (f) represented by any one of the aforementioned formulae (f1-1) to (f1-5) or a structural unit (f1) represented by the aforementioned general formula (f1-1) or (f1-2) is preferable.

In the present invention, the resin component (F) may include a polymeric compound (F1) containing a base decomposable group in the main chain thereof (hereafter, referred to as "polymeric compound (F1)"). The base decomposable group contained in the main chain of the polymeric compound (F1) is not particularly limited as long as it renders the polymer soluble in an alkali developing solution. Specifically, the aforementioned base decomposable group or a base decomposable group represented by the aforementioned general formula (I) is preferable, and it is most preferable that the main chain contains a base decomposable group represented by the aforementioned general formula (I).

In the case where the resist composition contains a fluorine-containing polymer, when the molecular weight of the resist composition is small, fluorine is less likely to be segregated on the surface layer. Therefore, it becomes necessary to increase the amount of the fluorine-containing polymer added. When the amount of the fluorine-containing polymer added is increased, a problem arise in that the lithography properties are deteriorated. In the case where the resist composition contains a fluorine-containing polymer, by virtue of using a resist composition containing a fluorine additive or a polymeric compound containing a base decomposable group in the main chain thereof, it is presumed that the fluorine additive can be segregated on the surface of the resist film prior to alkali developing, and the main chain is decomposed during alkali developing, thereby increasing the solubility in the developing solution.

The resist composition of the present invention preferably contains the base component (A) and the resin component (F), and the resin component (F) preferably contains the polymeric compound (F1). In such a case, it is preferable that the resist composition includes a polymeric compound containing a base decomposable group in the main chain thereof, and it is most preferable that the resist composition includes a polymeric compound containing a base decomposable group represented by the aforementioned general formula (I) in the main chain thereof.

The polymeric compound (F1) may contain the aforementioned structural unit (f1) and the aforementioned structural unit (a1).

The weight average molecular weight (Mw) (the polystyrene equivalent value determined by gel permeation chromatography) of the resin component (F) is preferably 1,000 to 100,000, more preferably 5,000 to 80,000, and most preferably 10,000 to 60,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the resin component (F) is preferably 1.0 to 5.0, more preferably 1.0 to 4.0, and most preferably 1.2 to 3.0.

As the resin component (F), one kind may be used alone, or two or more kinds may be used in combination.

The resin component (F) is used in an amount of 0.5 to 20 parts by weight, relative to 100 parts by weight of the component (A), preferably 1 to 10 parts by weight, and more preferably 1.5 to 5 parts by weight.

The resist composition of the present invention includes a polymeric compound containing a base decomposable group in the main chain thereof; however, when the base component (A) contains the polymeric compound, the amount of the polymeric compound based on the entire component (A) is preferably 50% by weight or more, more preferably 60% by weight or more, and still more preferably 70% by weight or more. The upper limit is not particularly limited, but is preferably 100% by weight. By virtue of the above-mentioned range, it is considered that the lithography properties are improved.

In the resist composition of the present invention, when the fluorine-containing resin component (F) includes the polymeric compound (F1) containing a base decomposable group in the main chain thereof, the amount of the component (F1) based on the entire component (F) is preferably 1 to 100% by weight, and more preferably 10 to 100% by weight.

By virtue of the above-mentioned range, it is considered that the lithography properties and the effect of reducing defects are improved.

In the resist composition of the present invention, when the base component (A) includes a polymeric compound containing a base decomposable group in the main chain thereof, and the component (F) includes the polymeric compound (F1), the amount of the polymeric compounds are the same as defined above. By virtue of the above-mentioned range, it is considered that the lithography properties and the effect of reducing defects are improved.

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

<<Polymeric Compound>>

The polymeric compound of the present invention preferably contains a base decomposable group represented by general formula (I) shown below in the main chain thereof. The explanation of general formula (I) is the same as defined above. The polymeric compound of the present invention may include a base decomposable group represented by general formula (I) shown below and a structural unit (a1) containing an acid decomposable group that exhibits increased polarity by the action of acid. The explanation of the structural unit (a1) is the same as defined above. The polymeric compound of the present invention may include a base decomposable group represented by general formula (I) shown below and a structural unit (f) containing a fluorine atom. The explanation of the structural unit (f) is the same as defined above.

[Chemical Formula 51]

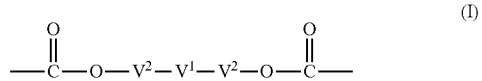

(I)

In the formula, $V^1$ represents a fluorinated alkylene group which may have a substituent; and $V^2$ each independently represents an alkylene group of 1 to 3 carbon atoms.

<<Production Method of Polymeric Compound>>

The production method of the polymeric compound of the present invention includes reacting a polymeric compound represented by general formula (II) shown below having a carboxy group on one terminal thereof with a diol represented by general formula (III) shown below, thereby producing a polymeric compound represented by general formula (IV) shown below.

"Poly" means a polymer; however, in the case where the polymer is polymerized by a polymerization initiator or the like, "Poly" refers to the structure including the residual group of the polymerization initiator or the like, excluding the terminal carboxy group.

[Chemical Formula 52]

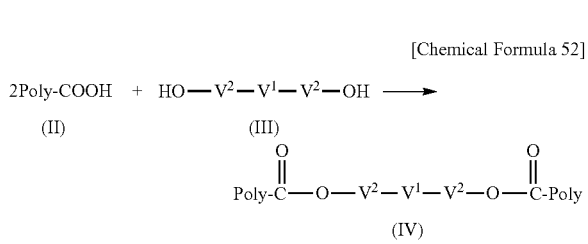

In the formula, $V^1$ represents a fluorinated alkylene group which may have a substituent; and $V^2$ each independently represents an alkylene group of 1 to 3 carbon atoms.

The fluorinated alkylene group (which may have a substituent) for $V^1$ in general formulae (III) and (IV) is the same as defined for the fluorinated alkylene group (which may have a substituent) for $V^1$ in the aforementioned general formula (I). Further, $V^2$ in general formulae (III) and (IV) is the same as defined for $V^2$ in the aforementioned general formula (I).

The polymeric compound represented by Poly-COOH in general formula (II) which has a carboxy group only on one terminal thereof is not particularly limited, and examples thereof include a polymeric compound including a combination of the aforementioned structural units in the explanation of the components (A) and (F). Among these, a polymer selected from a homopolymer consisting of a structural unit (f) or (f1); a copolymer of the aforementioned structural unit (a1) and a structural unit selected from a structural unit (f) represented by any one of the aforementioned formulae (f1-1) to (f1-5) or a structural unit (f1) represented by the aforementioned general formula (f1-1) or (f1-2); a copolymer of the aforementioned structural unit (a1), the aforementioned structural unit (a2) and a structural unit selected from a structural unit (f) represented by any one of the aforementioned formulae (f1-1) to (f1-5) or a structural unit (f1) represented by the aforementioned general formula (f1-1) or (f1-2); a copolymer of the structural unit represented by the aforementioned general formula (a1-1) and a structural unit selected from the structural unit (f) and the structural unit (f1); a copolymer of the structural unit represented by the aforementioned general formula (a1-2) and a structural unit selected from the structural unit (f) and the structural unit (f1); a copolymer of the aforementioned structural unit (a1) and the aforementioned structural unit (a2); a copolymer of the aforementioned structural unit (a1), the aforementioned structural unit (a2) and the aforementioned structural unit (a3); a copolymer of the aforementioned structural unit (a1), the aforementioned structural unit (a5) and the aforementioned structural unit (a3); a copolymer of the aforementioned structural unit (a1), the aforementioned structural unit (a2), the aforementioned structural unit (a3) and the aforementioned structural unit (a5); or a copolymer of the aforementioned structural unit (a1), the aforementioned structural unit (a2), the aforementioned structural unit (a3) and the aforementioned structural unit (a4), which has a carboxy group on one terminal thereof is preferable. These polymeric compounds having a carboxy group only on one terminal thereof can be readily polymerized by using a polymerization initiator which forms a carboxy group only on one terminal (e.g., a nucleophilic reagent such as 4,4-dimethylaminopyridine, or a dehydration-condensation agent such as 1-ethyl-3-(3-dimethylaminopropyl)carbodiimide.

By reacting the polymeric compound represented by general formula (II) with a polyhydric alcohol compound such as the diol represented by general formula (III), a polymeric compound represented by general formula (IV) having a molecular weight of at least twice as large as the molecular weight of the polymeric compound represented by general formula (II) can be obtained.

<<Method of Forming a Resist Pattern>>

More specifically, the method for forming a resist pattern according to the present invention can be performed, for example, as follows.

Firstly, the resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 30% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The resist composition of the present invention exhibits the effect of reducing defects (surface defects) of resist pattern while maintaining the lithography properties. The reason for this has not been elucidated yet, but is presumed as follows.

The resist composition of the present invention includes a polymeric compound containing a base decomposable group in a main chain thereof. By virtue of such configuration, in an alkali developing process, the main chain is decomposed upon developing, thereby reducing the molecular weight. It is presumed that, as a result of the main chain being decomposed, the solubility of the resist composition in an alkali developing solution is increased, thereby reducing defects (surface defects) of the resist pattern caused by undissolved residues.

On the other hand, prior to developing, since the main chain is not decomposed, it is presumed that problems such as decrease in Tg due to the low molecular weight of the resist composition and deterioration of lithography properties do not occur. As such, it is presumed that defects (surface defects) of resist pattern can be reduced while maintaining the lithography properties.

EXAMPLES

The present invention will be described more specifically with reference to the following examples, although the scope of the present invention is by no way limited by these examples.

[Polymer Synthesis Example]

Polymeric compounds 1 to 12 were produced using the following monomers (1) to (8) which derived the structural units constituting each polymeric compound. The polymeric compounds 2 to 7 and 9 to 12 were synthesized in the same manner as polymeric compound 1. Polymeric compounds 8 to 10 were synthesized in the same manner as polymeric compound 1', i.e., under conventional conditions by changing the initiator to dimethyl 2,2'-azobis(isobutyrate) (V-601).

With respect to the obtained compounds, the compositional ratio (the molar ratio of the respective structural units indicated in the structural formula shown below) as determined by carbon 13 nuclear magnetic resonance spectroscopy (600 MHz_$^{13}$C-NMR; internal standard: tetramethylsilane), and the weight average molecular weight (Mw) and the molecular weight dispersity (Mw/Mn) determined by the polystyrene equivalent value as measured by GPC are shown in Tables 1 and 2. In Tables 1 and 2, "ECL" indicates the presence of the portion linking the polymer chains, and the polymeric compounds in which the column of "ECL" is blank means that the linking portion is not present. In Tables 1 and 2, "ECL1" and "ECL3" means that the ECL is represented by the following formula (ECL):

[Chemical Formula 53]

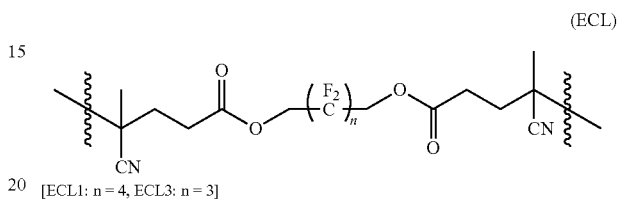

[ECL1: n = 4, ECL3: n = 3]

Synthesis of Polymeric Compound 1'

In a separable flask equipped with a thermometer, a reflux tube and a nitrogen feeding pipe, 27.88 g of methyl ethyl ketone (MEK) was added, and heated to 80° C. Then, a solution obtained by dissolving 40.00 g (176.87 mmol) of a compound 1 and 7.07 mmol of 4,4'-azobis(4-cyanovaleric acid) (V-501) in 33.39 g of MEK and 18.00 g of tetrahydrofuran (THF) was dropwise added in a nitrogen atmosphere over 3 hours.

After the dropwise addition, the reaction liquid was heated for 3 hours while stirring, followed by cooling the reaction liquid to room temperature. The resulting polymer solution was dropwise added to an excess amount of n-heptane to thereby precipitate a polymer. Then, the precipitated white powder was separated by filtration, followed by drying, thereby obtaining 34.30 g of polymeric compound 1'.

With respect to polymeric compound 1', the weight average molecular weight (Mw) and the dispersity (Mw/Mn) were determined by the polystyrene equivalent value as measured by gel permeation chromatography (GPC). As a result, it was found that the weight average molecular weight was 12,500, and the dispersity was 1.85.

Further, as a result of an analysis by carbon 13 nuclear magnetic resonance spectroscopy (600 MHz_$^{13}$C-NMR), it was found that the molar ratio of polymeric compound 1' and the carboxy group-containing terminal was 96.8/3.2.

[Chemical Formula 54]

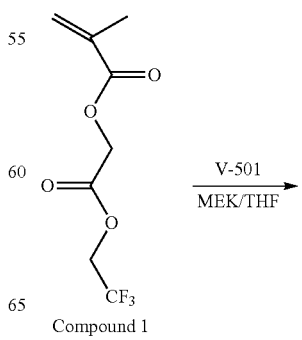

Compound 1

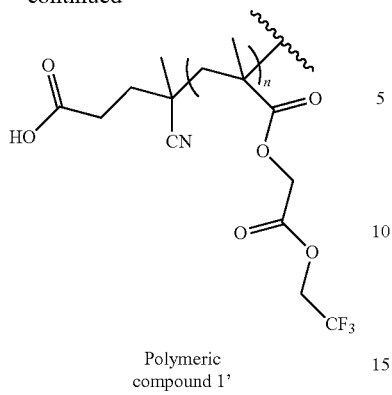

Polymeric
compound 1'

Synthesis of Polymeric Compound 1

In a nitrogen atmosphere, 10.00 g of polymeric compound 1', 0.009 g of 4,4-dimethylaminopyridine (DMAP) and 0.303 g of 1-ethyl-3-(3-dimethylaminopropyl)carbodiimide hydrochloride (WSC) were added to 50.00 g of dichloromethane, and cooled to 5° C. Then, 0.188 g of 2,2',3,3',4,4',5,5'-octafluoro-1,6-hexanediol (OFHD) dissolved in 5.00 g of acetonitrile was gradually added thereto, and reacted at 5° C. for 4 hours.

After the completion of the reaction, the reaction liquid was washed with aqueous hydrochloric acid and pure water, followed by concentration and drying, thereby obtaining 8.0 g of the objective polymeric compound 1.

Polymeric compound 1 was analyzed by NMR, and the structure thereof was identified by the following results.

$^{19}$F-NMR (376 MHz, DMSO-d6): δ(ppm)=−69.8, −115.7, −119.6

The weight average molecular weight (Mw) and the dispersity (Mw/Mn) in terms of the polystyrene equivalent value measured by gel permeation chromatography (GPC) were 24,000 and 2.00, respectively.

[Chemical Formula 55]

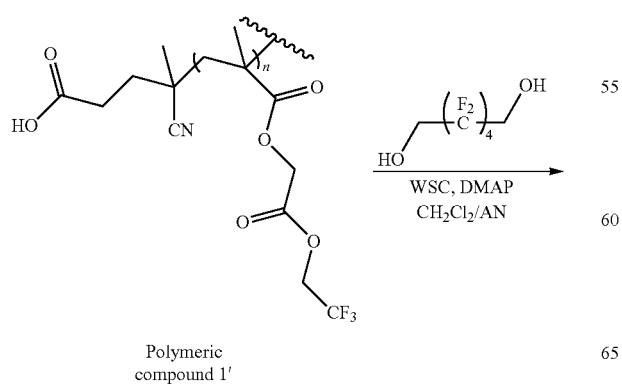

Polymeric
compound 1'

[Chemical Formula 56]

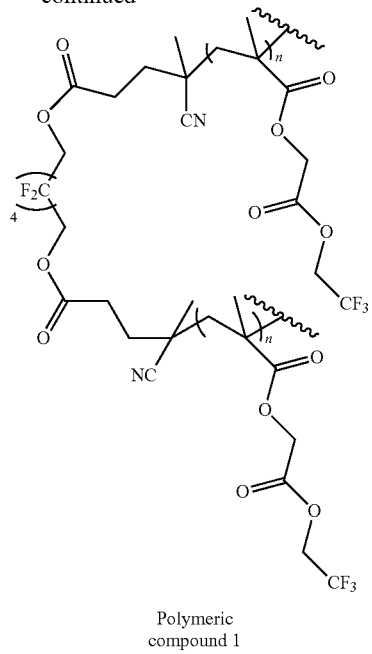

Polymeric
compound 1

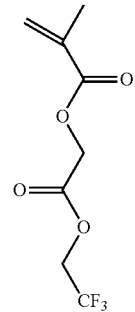

(1)

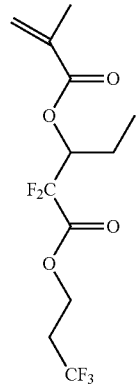

(2)

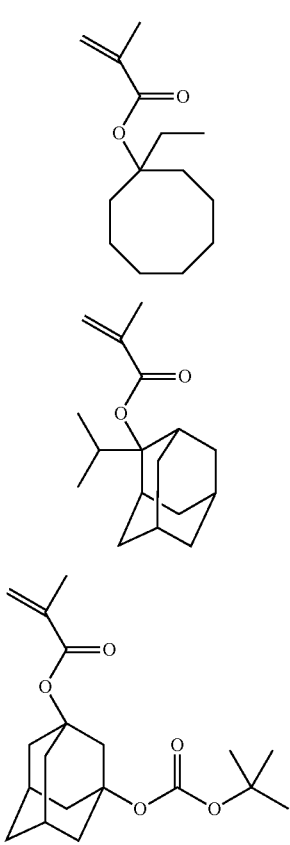
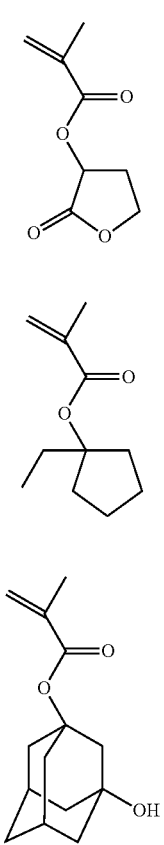
TABLE 1
|  |  | Polymeric compound | | | | | |
|---|---|---|---|---|---|---|---|
|  |  | 1 | 2 | 3 | 4 | 5 | 6 |
| Monomer | (1) | 100 | 100 | 100 |  | 80 | 80 |
|  | (2) |  |  |  | 100 |  |  |
|  | (3) |  |  |  |  | 20 |  |
|  | (4) |  |  |  |  |  | 20 |
|  | (5) |  |  |  |  |  |  |
|  | (6) |  |  |  |  |  |  |
|  | (7) |  |  |  |  |  |  |
|  | (8) |  |  |  |  |  |  |
| ECL |  | ECL1 | ECL1 | ECL3 | ECL1 | ECL1 | ECL1 |
| Mw |  | 24000 | 50000 | 26000 | 25000 | 30000 | 28000 |
| Mw/Mn |  | 2.00 | 2.80 | 2.10 | 2.00 | 2.70 | 2.50 |
TABLE 2
|  |  | Polymeric compound | | | | | |
|---|---|---|---|---|---|---|---|
|  |  | 7 | 8 | 9 | 10 | 11 | 12 |
| Monomer | (1) | 80 | 100 | 100 |  |  |  |
|  | (2) |  |  |  |  |  |  |
|  | (3) |  |  |  |  |  |  |
|  | (4) |  |  |  |  |  |  |
|  | (5) | 20 |  |  |  |  |  |
|  | (6) |  |  |  | 40 | 40 | 40 |
|  | (7) |  |  |  | 40 | 40 | 40 |
|  | (8) |  |  |  | 20 | 20 | 20 |
| ECL |  | ECL1 |  |  |  | ECL1 | ECL3 |
| Mw |  | 26000 | 24000 | 12000 | 7300 | 7500 | 7600 |
| Mw/Mn |  | 2.60 | 1.80 | 1.50 | 1.50 | 1.80 | 1.90 |

TABLE 3

| | Component (A) | Component (F) | Component (B) | Component (D) | Component (S) | | |
|---|---|---|---|---|---|---|---|
| Example 1 | (A)-10 [100] | (F)-1 [3] | (B)-1 [12] | (D)-1 [5] | (S)-1 [1410] | (S)-2 [940] | (S)-3 [780] |
| Example 2 | (A)-10 [100] | (F)-2 [2] | (B)-1 [12] | (D)-1 [5] | (S)-1 [1410] | (S)-2 [940] | (S)-3 [780] |
| Example 3 | (A)-10 [100] | (F)-3 [3] | (B)-1 [12] | (D)-1 [5] | (S)-1 [1410] | (S)-2 [940] | (S)-3 [780] |
| Example 4 | (A)-10 [100] | (F)-4 [3] | (B)-1 [12] | (D)-1 [5] | (S)-1 [1410] | (S)-2 [940] | (S)-3 [780] |
| Example 5 | (A)-10 [100] | (F)-5 [3] | (B)-1 [12] | (D)-1 [5] | (S)-1 [1410] | (S)-2 [940] | (S)-3 [780] |
| Example 6 | (A)-10 [100] | (F)-6 [3] | (B)-1 [12] | (D)-1 [5] | (S)-1 [1410] | (S)-2 [940] | (S)-3 [780] |
| Example 7 | (A)-10 [100] | (F)-7 [3] | (B)-1 [12] | (D)-1 [5] | (S)-1 [1410] | (S)-2 [940] | (S)-3 [780] |
| Example 8 | (A)-11 [100] | (F)-8 [3] | (B)-1 [12] | (D)-1 [5] | (S)-1 [1410] | (S)-2 [940] | (S)-3 [780] |
| Example 9 | (A)-12 [100] | (F)-8 [3] | (B)-1 [12] | (D)-1 [5] | (S)-1 [1410] | (S)-2 [940] | (S)-3 [780] |
| Example 10 | (A)-11 [100] | (F)-1 [3] | (B)-1 [12] | (D)-1 [5] | (S)-1 [1410] | (S)-2 [940] | (S)-3 [780] |
| Comparative Example 1 | (A)-10 [100] | (F)-8 [3] | (B)-1 [12] | (D)-1 [5] | (S)-1 [1410] | (S)-2 [940] | (S)-3 [780] |
| Comparative Example 2 | (A)-10 [100] | (F)-9 [3] | (B)-1 [12] | (D)-1 [5] | (S)-1 [1410] | (S)-2 [940] | (S)-3 [780] |
| Comparative Example 3 | (A)-10 [100] | (F)-9 [6] | (B)-1 [12] | (D)-1 [5] | (S)-1 [1410] | (S)-2 [940] | (S)-3 [780] |

TABLE 4

| | Component (A) | Component (F) | Component (B) | Component (D) | Component (S) | | |
|---|---|---|---|---|---|---|---|
| Example 11 | (A)-11 [100] | (F)-8 [3] | (B)-1 [12] | (D)-1 [5] | (S)-1 [1410] | (S)-2 [940] | (S)-3 [780] |
| Example 12 | (A)-12 [100] | (F)-8 [3] | (B)-1 [12] | (D)-1 [5] | (S)-1 [1410] | (S)-2 [940] | (S)-3 [780] |
| Example 13 | (A)-10 [100] | (F)-1 [3] | (B)-1 [12] | (D)-1 [5] | (S)-1 [1410] | (S)-2 [940] | (S)-3 [780] |
| Comparative Example 4 | (A)-10 [100] | (F)-8 [3] | (B)-1 [12] | (D)-1 [5] | (S)-1 [1410] | (S)-2 [940] | (S)-3 [780] |

TABLE 5

| | Receding angle (°) | LWR | No. of defects (unexposed portion) |
|---|---|---|---|
| Example 1 | 70 | 2 | <100 |
| Example 2 | 70 | 2 | 100 |
| Example 3 | 70 | 2.1 | <100 |
| Example 4 | 76 | 1.9 | <100 |
| Example 5 | 74 | 2 | <100 |
| Example 6 | 74 | 2.1 | 100 |
| Example 7 | 75 | 2.2 | 100 |
| Example 8 | 70 | 1.9 | 200 |
| Example 9 | 70 | 1.9 | 200 |
| Example 10 | 71 | 1.8 | <100 |
| Comparative Example 1 | 70 | 2.4 | 400 |
| Comparative Example 2 | 65 | | Not able to evaluate due to lack of water repellency |
| Comparative Example 3 | 69 | 2.9 | 200 |

TABLE 6

| | LWR |
|---|---|
| Example 11 | 6.4 |
| Example 12 | 6.3 |
| Example 13 | 7.1 |
| Comparative Example 4 | 7.5 |

In Tables 3 and 4, the reference characters indicate the following. The values in brackets [ ] indicate the amount (in terms of parts by weight) of the component added.

(A)-10 to (A)-12: the aforementioned polymeric compounds 10 to 12

(F)-1 to (F)-9: the aforementioned polymeric compounds 1 to 9

(B)-1: a compound represented by structural formula (B)-1 shown below (D)-1: a compound represented by structural formula (D)-1 shown below (S)-1: PGMEA.
(S)-2: PGME
(S)-3: cyclohexanone

[Chemical Formula 57]

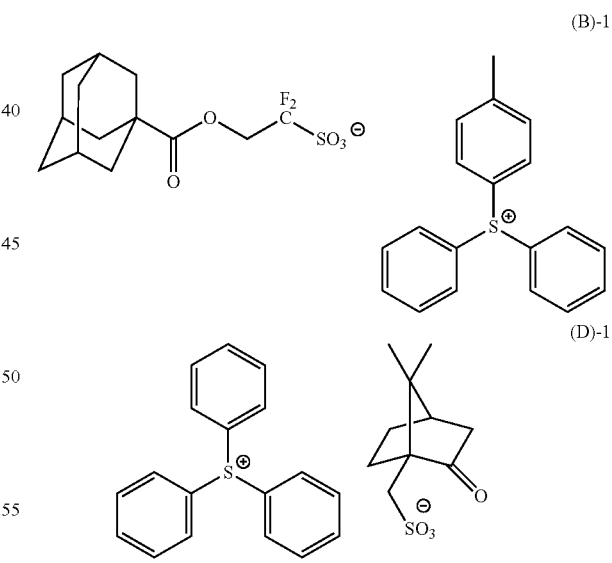

Using the obtained resist compositions, the following evaluations were conducted.

<Formation of Resist Pattern 1>

An organic anti-reflection film composition (product name: ARC29A, manufactured by Brewer Science Ltd.) was applied to a 12-inch silicon wafer using a spinner, and the composition was then baked on a hot plate at 205° C. for 60 seconds, thereby forming an organic anti-reflection film having a film thickness of 82 nm. Then, each resist composition obtained in the examples was uniformly applied to the organic anti-reflection film using a spinner, and was then prebaked (PAB) at 110° C. for 60 seconds, thereby forming a resist film (film thickness: 90 nm). Subsequently, the resist film was selectively irradiated with an ArF excimer laser through a mask, using an ArF immersion exposure apparatus NSR-S609 (manufactured by Nikon Corporation, NA (numerical aperture)=1.07, Cross pole (in/out=0.78/0.97) with Polano). Then, a bake treatment (PEB) was conducted at 95° C. for 60 seconds. Thereafter, an alkali development was conducted with a 2.38 wt % aqueous TMAH solution (product name: NMD-3; manufactured by Tokyo Ohka Kogyo Co., Ltd.) at 23° C. for 10 seconds.

As a result, in Examples 1 to 10 and Comparative Examples 1 to 3, a line and space resist pattern (hereafter, referred to as "LS pattern") having a line width of 55 nm and a pitch of 110 nm was formed.

<Formation of Resist Pattern 2>

The prepared resist composition was applied to an 8-inch silicon wafer using a spinner, and was then prebaked (PAB) on a hotplate at 110° C. for 60 seconds and dried, thereby forming a resist film having a film thickness of 90 nm.

Using an ArF exposure apparatus NSR-S302 (a product name, manufactured by Nikon Corporation), the resist film was then selectively exposed with an ArF excimer laser (193 nm) through a mask. Then, a post exposure bake (PEB) treatment was conducted at 95° C. for 60 seconds. Thereafter, an alkali development was conducted with a 2.38 wt % aqueous TMAH solution (product name: NMD-3; manufactured by Tokyo Ohka Kogyo Co., Ltd.) at 23° C. for 30 seconds. As a result, in Examples 11 to 13 and Comparative Example 4, a line and space resist pattern (hereafter, referred to as "LS pattern") having a line width of 130 nm and a pitch of 260 nm was formed.

[Evaluation of Line Width Roughness (LWR)]

With respect to the LS patterns having a line width of 55 nm and a pitch of 110 nm and the LS patterns having a line width of 130 nm and a pitch of 260 nm formed in the above <Formation of resist pattern>, 3σ was determined as a yardstick for indicating LWR.

"3σ" indicates a value of 3 times the standard deviation (σ) (i.e., 3(s)) (unit: nm) determined by measuring the line width at 400 points in the lengthwise direction of the line using a scanning electron microscope (product name: S-9220, manufactured by Hitachi High-Technologies Corporation; acceleration voltage: 800V). The smaller this 3s value is, the lower the level of roughness of the line side walls, indicating that a LS pattern with a uniform width was obtained. The results are indicated under "LWR (nm)" in Tables 5 and 6.

[Measurement of Receding Angle]

50 μL of water was dropped onto the surface on the resist coating film side, and the receding angle was measured using DROP MASTER-700 (manufactured by Kyowa Interface Science Co. Ltd.).

[Evaluation of Defect]

The LS patterns obtained above were observed using a surface defect observing apparatus (product name: KLA2371; manufactured by KLA-Tencor Corporation). The number of development defects at unexposed portions per 1 silicon wafer was measured. The results are shown in Table 5.

[Confirmation of Decomposition of Main Chain]

0.80 g of deuterated dimethyl sulfoxide and 0.05 g of polymeric compound 1 were placed in an NMR tube, and then 0.05 g of a 25 wt % aqueous tetramethylammonium hydroxide solution was added thereto. As a result of an NMR measurement, the following results were obtained.

19F-NMR (376 MHz, DMSO-d6): δ(ppm)−72.6, −118.7, −121.1

These results correspond to 2,2',3,3',4,4',5,5'-octafluoro-1,6-hexanediol (OFHD) (δ(ppm)=−118.7, −121.1) and 2,2',2"-trifluoroethanol (δ(ppm)=−72.6). Thus, it was confirmed that the main chain was decomposed.

[Chemical Formula 58]

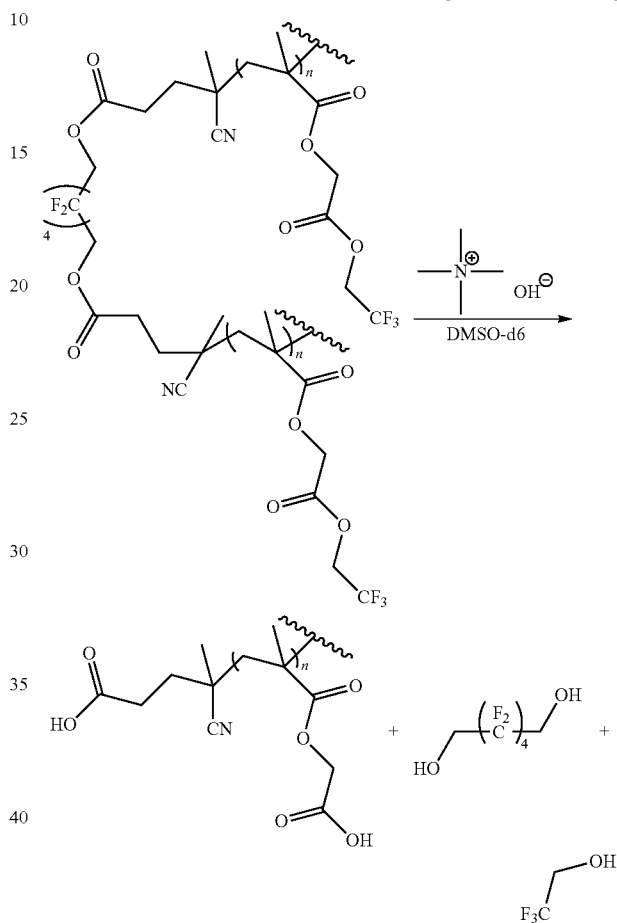

According to the present invention, there were provided a resist composition which exhibits high solubility in an alkali developing solution and can reduce defects while maintaining the lithography properties; and a method for forming a resist pattern using the resist composition.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in an alkali developing solution under action of acid, the resist composition comprising a polymeric compound containing a base decomposable group represented by general formula (I) shown below in a main chain thereof:

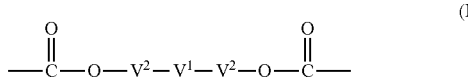

(I)

wherein $V^1$ represents a fluorinated alkylene group which may have a substituent, and $V^2$ each independently represents an alkylene group of 1 to 3 carbon atoms.

2. The resist composition according to claim 1, which comprises a base component (A) that exhibits changed solubility in an alkali developing solution under action of an acid, wherein the base component (A) comprises a polymeric compound containing a base decomposable group in a main chain thereof 3. The resist composition according to claim 2, wherein the base component (A) comprises a structural unit (a1) containing an acid decomposable group which exhibits increased polarity by the action of acid.

4. The resist composition according to claim 1, which comprises a fluorine-containing resin component (F) comprising a structural unit (f) containing a fluorine atom.

5. The resist composition according to claim 4, wherein the fluorine-containing resin component (F) comprises a structural unit (f1) which has a fluorine atom and containing a base decomposable group.

6. The resist composition according to claim 4, wherein the fluorine-containing resin component (F) comprises a structural unit (a1) containing an acid decomposable group which exhibits increased polarity by the action of acid.

7. The resist composition according to claim 4, wherein the a fluorine-containing resin component (F) comprises a polymeric compound (F1) containing a base decomposable group in a main chain thereof 8. The resist composition according to claim 7, wherein the polymeric compound (F1) contains a base decomposable group represented by the general formula (I) above shown below in a main chain thereof:

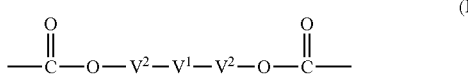

(I)

wherein $V^1$ represents a fluorinated alkylene group which may have a substituent; and $V^2$ each independently represents an alkylene group of 1 to 3 carbon atoms.

9. The resist composition according to claim 1, which comprises a base component (A) that exhibits changed solubility in an alkali developing solution under action of an acid and a fluorine-containing resin component (F) comprising a structural unit (f) containing a fluorine atom, wherein the fluorine-containing resin component (F) comprises a polymeric compound (F1) containing a base decomposable group in a main chain thereof.

10. The resist composition according to claim 9, wherein the polymeric compound (F1) comprises a structural unit (f1) which has a fluorine atom and a base decomposable group.

11. The resist composition according to claim 9, wherein the polymeric compound (F1) comprises a structural unit (a1) containing an acid decomposable group which exhibits increased polarity by the action of acid.

12. A method of forming a resist pattern, comprising:
   forming a resist film on a substrate using the resist composition of claim 1;
   conducting exposure of the resist film; and
   developing the resist film to form a resist pattern.

13. A polymeric compound comprising a base decomposable group represented by general formula (I) shown below in a main chain thereof:

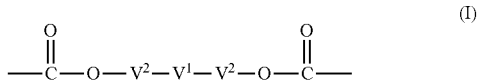

(I)

wherein $V^1$ represents a fluorinated alkylene group which may have a substituent; and each $V^2$ independently represents an alkylene group of 1 to 3 carbon atoms.

14. The polymeric compound according to claim 13, which comprises a structural unit (a1) containing an acid decomposable group which exhibits increased polarity by the action of acid.

15. The polymeric compound according to claim 13, which comprises a structural unit (f) containing a fluorine atom.

16. A method of producing a polymeric compound, the method comprising:
   reacting a polymeric compound represented by general formula (II) shown below having a carboxy group only on one terminal thereof with a diol represented by general formula (III) shown below, thereby producing a polymeric compound represented by general formula (IV) shown below:

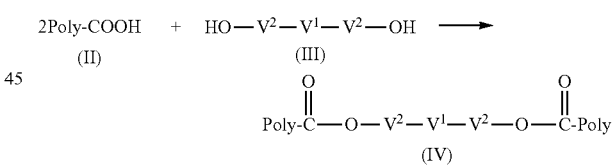

wherein $V^1$ represents a fluorinated alkylene group which may have a substituent; and each $V^2$ independently represents an alkylene group of 1 to 3 carbon atoms.

* * * * *

UNITED STATES PATENT AND TRADEMARK OFFICE
CERTIFICATE OF CORRECTION

PATENT NO.       : 9,091,915 B2
APPLICATION NO.  : 13/899170
DATED            : July 28, 2015
INVENTOR(S)      : Daichi Takaki et al.

Page 1 of 2

It is certified that error appears in the above-identified patent and that said Letters Patent is hereby corrected as shown below:

In the Specification
Col. 22, line 44, "thereof" should be --thereof.--.
Col. 28, line 44, "1 is" should be --l is--.
Col. 31, line 11, "—$SO_2$-containing" should be -- —$SO_2$— containing--.
Col. 31, lines 15-16, "—O—S—within" should be -- —O—S— within--.
Col. 31, lines 18-20, delete "More specific examples of the —$SO_2$— containing cyclic group include groups represented by general formulas (a5-r-l) to (a5-r-4) shown below." and insert the same on col. 31, line 17, after "desirable." as a continuation of paragraph.
Col. 36, line 65, "(a1-r-1-1)," should be --(r-s1-1-1),--.
Col. 36, line 67, "(a1-r-1-1)" should be --(r-s1-1-1)--.
Col. 38, line 7, "thereof" should be --thereof.--.
Col. 44, line 21, "(a1-r-1)" should be --(y-a1-1)--.
Col. 44, line 52, before "cyclic" insert --aliphatic--.
Col. 45, line 62, "aryl," should be --aryl--.
Col. 47, line 51, after "formulas" change "(ca-1)" to --(ca-1-1)--.
Col. 60, line 50, "(ca4)" should be --(ca-4)--.
Col. 64, line 19, "$YR^{01}$" should be --$Yf^{01}$--.
Col. 67, line 12, "—C(=O)—NH—$Y^{22}$—and" should be -- —C(=O)—NH—$Y^{22}$— and--.
Col. 67, lines 12-13, "—[$Y^{23}$—O]$_{n'}$—(provided" should be -- —[$Y^{23}$—O]$_{n'}$— (provided--.
Col. 68, line 35, "$YR^{01}$" should be --$Yf^{01}$--.
Col. 70, line 15, "$YR^{01}$" should be --$Yf^{01}$--.
Col. 84, line 50, after "or" "—$CH_Z$ $CH_2$—$CF_2$—$CF_ZCF_2$—$CF_3$" should be
-- —$CH_2$— $CH_2$—$CF_2$—$CF_2$—$CF_2$—$CF_3$--.
Col. 90, line 31, after "long" "at" should be --as--.
Col. 98, line 30, "(S)-1: PGMEA." should be --(S)-1: PGMEA--.
In the Claims
Col. 101, line 8 (Claim 1), "substituent," should be --substituent;--.
Col. 101, line 15 (Claim 2), "thereof" should be --thereof.--.
Col. 101, line 25 (Claim 5), after "and" delete "containing".

Signed and Sealed this
Fourteenth Day of June, 2016

Michelle K. Lee
*Director of the United States Patent and Trademark Office*

Col. 101, lines 32-33 (Claim 7), after "wherein" change "the a" to --the--.
Col. 101, line 35 (Claim 7), "thereof" should be --thereof.--.
Col. 101, line 38 (Claim 8), after "(I)" delete "above".